US010808150B2

(12) United States Patent
Kato et al.

(10) Patent No.: US 10,808,150 B2
(45) Date of Patent: *Oct. 20, 2020

(54) RESIN COMPOSITION, METHOD FOR MANUFACTURING SEMICONDUCTOR DEVICE USING RESIN COMPOSITION, AND SOLID-STATE IMAGING ELEMENT

(71) Applicant: HITACHI CHEMICAL COMPANY, LTD., Tokyo (JP)

(72) Inventors: Sadaaki Kato, Tokyo (JP); Mika Kimura, Tokyo (JP); Aya Ikeda, Tokyo (JP); Shinjiro Fujii, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 24 days.

This patent is subject to a terminal disclaimer.

(21) Appl. No.: 15/926,552

(22) Filed: Mar. 20, 2018

(65) Prior Publication Data

US 2018/0208807 A1 Jul. 26, 2018

Related U.S. Application Data

(63) Continuation of application No. 15/114,983, filed as application No. PCT/JP2015/052505 on Jan. 29, 2015, now Pat. No. 9,920,227.

(30) Foreign Application Priority Data

Jan. 29, 2014 (JP) ................................. 2014-014861
Jan. 29, 2014 (JP) ................................. 2014-014863

(51) Int. Cl.
| | | |
|---|---|---|
| C09J 133/14 | (2006.01) | |
| C08F 220/18 | (2006.01) | |
| C08F 220/34 | (2006.01) | |
| C09J 4/06 | (2006.01) | |
| C09J 133/06 | (2006.01) | |
| H01L 27/146 | (2006.01) | |
| C08F 220/32 | (2006.01) | |

(52) U.S. Cl.
CPC ........... *C09J 133/14* (2013.01); *C08F 220/18* (2013.01); *C08F 220/32* (2013.01); *C08F 220/34* (2013.01); *C09J 4/06* (2013.01); *C09J 133/06* (2013.01); *H01L 27/1464* (2013.01); *H01L 27/14618* (2013.01); *H01L 27/14632* (2013.01); *H01L 27/14687* (2013.01); *C08F 220/325* (2020.02); *H01L 27/14627* (2013.01); *H01L 2224/48091* (2013.01); *H01L 2224/48227* (2013.01); *H01L 2224/73265* (2013.01); *H01L 2224/97* (2013.01); *H01L 2924/181* (2013.01)

(58) Field of Classification Search
CPC .......... C09J 133/14; C09J 133/06; C09J 4/06; C08F 220/32; C08F 220/34; C08F 220/18; C08F 2220/325

See application file for complete search history.

(56) References Cited

U.S. PATENT DOCUMENTS

| | | |
|---|---|---|
| 2001/0044075 A1 | 11/2001 | Nishimura et al. |
| 2007/0117349 A1 | 5/2007 | Komatsu et al. |
| 2007/0257285 A1 | 11/2007 | Yang et al. |
| 2009/0026383 A1 | 1/2009 | Kim et al. |
| 2010/0165267 A1 | 7/2010 | Yoshida et al. |
| 2011/0140282 A1 | 6/2011 | Nakano |
| 2013/0168761 A1 | 7/2013 | Hsieh |
| 2014/0128547 A1* | 5/2014 | Yonemura ............. C08F 222/40 525/205 |
| 2014/0221568 A1* | 8/2014 | Kikuta ....................... C08J 5/18 524/747 |
| 2014/0315036 A1* | 10/2014 | Kobayashi ................ C09J 4/06 428/522 |

FOREIGN PATENT DOCUMENTS

| | | |
|---|---|---|
| CN | 1930263 | 3/2007 |
| CN | 1954411 A | 4/2007 |
| CN | 101033380 A | 9/2007 |
| CN | 101343517 A | 1/2009 |
| CN | 101490759 A | 7/2009 |
| CN | 101910344 A | 12/2010 |
| CN | 102375340 | 3/2012 |
| CN | 103249791 A | 8/2013 |
| CN | 103257527 | 8/2013 |
| CN | 103992751 A | 8/2014 |
| CN | 105378899 A | 3/2016 |
| JP | H04-202335 A | 7/1992 |
| JP | 2001-302870 A | 10/2001 |
| JP | 2005-142221 A | 6/2005 |
| JP | 2006-137855 A | 6/2006 |
| JP | 2006-193660 A | 7/2006 |

(Continued)

OTHER PUBLICATIONS

Aloui, F., et al.; Express Polymer Letters, vol. 12, No. 11, 2018, p. 966-971.*
Sastri, V.; Plastics in Medical Devices, 2010, Chapter 7, p. 121-173.*
Notice of Allowance dated Sep. 8, 2017, in U.S. Appl. No. 15/115,057.
Office Action of counterpart CN Patent Application No. 201580005756.8 dated Apr. 28, 2017.
Office Action of CN Patent Application No. 201580005738.X dated Mar. 30, 2017.
Office Action of U.S. Appl. No. 15/115,057, dated Feb. 15, 2017.
International Preliminary Report on Patentability of WO Patent Application No. PCT/JP2015/052544 dated Aug. 11, 2016 in English.

(Continued)

*Primary Examiner* — Robert S Jones

(74) *Attorney, Agent, or Firm* — Fitch, Even, Tabin & Flannery, L.L.P.

(57) ABSTRACT

A resin composition comprising (a) an acrylic polymer, (b) a compound having at least one (meth)acryloyl group and (c) a polymerization initiator, in which the absolute value of refractive index difference between the component (a) an acrylic polymer and the component (b) having at least one (meth)acryloyl group at 100° C. is 0.031 or less.

14 Claims, 21 Drawing Sheets

(56) References Cited

FOREIGN PATENT DOCUMENTS

| | | |
|---|---|---|
| JP | 2006-213848 A | 8/2006 |
| JP | 2006-233074 A | 9/2006 |
| JP | 2007-281375 A | 10/2007 |
| JP | 2010-001449 A | 1/2010 |
| JP | 2010-040621 A | 2/2010 |
| JP | 2010-106095 A | 5/2010 |
| JP | 2010-132801 A | 6/2010 |
| JP | 2010-177613 A | 8/2010 |
| JP | 2011-509332 A | 3/2011 |
| JP | 2011-140626 A | 7/2011 |
| JP | 2011-169828 A | 9/2011 |
| JP | 2011-213953 A | 10/2011 |
| JP | 2012-053229 A | 3/2012 |
| JP | 2012-058725 A | 3/2012 |
| JP | 2012-107191 A | 6/2012 |
| JP | 2012-167174 A | 9/2012 |
| JP | 2013-054168 A | 3/2013 |
| JP | 2013-118230 A | 6/2013 |
| JP | 2013-122577 A | 6/2013 |
| JP | 2013-184966 A | 9/2013 |
| JP | 2013-184996 A | 9/2013 |
| JP | 2014-005320 A | 1/2014 |
| TW | 200825108 A | 6/2008 |
| TW | 201231585 A1 | 8/2012 |
| WO | 2008/020570 A1 | 2/2008 |
| WO | 2009/088191 A2 | 7/2009 |
| WO | 2012/077806 A1 | 6/2012 |
| WO | 2013/066597 A1 | 5/2013 |

OTHER PUBLICATIONS

International Preliminary Report on Patentability of WO Patent Application No. PCT/JP2015/052542 dated Aug. 11, 2016 in English.
International Preliminary Report on Patentability of WO Patent Application No. PCT/JP2015/052505 dated Aug. 11, 2016 in English.
International Search Report of WO Patent Application No. PCT/JP2015/052544 dated Apr. 28, 2015 in English.
International Search Report of WO Patent Application No. PCT/JP2015/052542 dated Apr. 28, 2015 in English.
International Search Report of WO Patent Application No. PCT/JP2015/052505 dated Apr. 28, 2015 in English.

\* cited by examiner

RESIN COMPOSITION, METHOD FOR MANUFACTURING SEMICONDUCTOR DEVICE USING RESIN COMPOSITION, AND SOLID-STATE IMAGING ELEMENT

CROSS-REFERENCE TO RELATED APPLICATIONS

This application is a continuation of U.S. Ser. No. 15/114,983, filed in the U.S on Jul. 28, 2016, which is a national phase application filed under 35 U.S.C. § 371 of International Application PCT/JP2015/052505, filed on Jan. 29, 2015, which claims priority from Japanese Patent Application No. 2014-014863, filed Jan. 29, 2014, and Japanese Patent Application No. 2014-014861, filed Jan. 29, 2014, the entire contents of each of which are hereby incorporated herein by reference.

TECHNICAL FIELD

The present disclosure relates to a resin composition, a method for manufacturing a semiconductor device using the resin composition, and a solid-state imaging element.

BACKGROUND ART

Recently, along with the popularization of digital still cameras and camera-equipped cellular phones, low power consumption and miniaturization of solid-state imaging elements have proceeded and CMOS (Complementary Metal Oxide Semiconductor) image sensors have been more and more used other than conventional CCD (Charge Coupled Device) image sensors. These image sensors are each formed of a sensor section (imaging pixel section), in which a plurality of pixels are two-dimensionally arranged in a single semiconductor chip, and a peripheral circuit section arranged outside the sensor section.

As the structure to a CMOS image sensor, a "frontside-illuminated" structure and a "backside-illuminated" structure are known (see, for example, Patent Literatures 1 and 2). In the frontside-illuminated CMOS image sensor of Patent Literature 1, incident light from outside passes through a glass substrate and a cavity and enters each of microlenses. The light beams are converged by the microlenses, pass through a color filter layer and a wiring layer and enter photodiodes. The light incident on the photodiodes is photo-electrically converted to generate signal charges and then electrical signals are produced from signal charges to obtain image data.

In contrast, in the backside-illuminated CMOS image sensor of Patent Literature 2, photodiodes are formed on one of the surface of a semiconductor substrate. On the same surface, a color filter layer and microlenses are arranged. Above the microlenses, a glass substrate is arranged via an adhesive layer and a cavity. On the other surface of the semiconductor substrate, a wiring layer is provided. According to the backside-illuminated structure, since light incident on the microlenses is received by a light receiving section without passing through the wiring layer, attenuation of light by the wiring layer is avoided and the light-receiving sensitivity is enhanced.

As the backside-illuminated CMOS image sensor, a structure, which comprises an adhesive layer formed on a silicon substrate having microlenses and in the outer periphery of the microlenses so as not to cover the microlenses, a low refractive index layer formed in the cavity surrounded by the adhesive layer, and a glass substrate formed via the adhesive layer and the low refractive index layer, is disclosed (see Patent Literature 3).

CITATION LIST

Patent Literature

Patent Literature 1: JP 2007-281375 A
Patent Literature 2: JP 2005-142221 A
Patent Literature 3: JP 2010-40621 A

SUMMARY OF INVENTION

Technical Problem

In the backside-illuminated CMOS image sensor having a cavity as described in, for example, Patent Literature 2, the difference in refractive index between layers is large because a glass substrate usually has a refractive index: nD=about 1.47; air in the cavity portion has a refractive index: nD=about 1.00; and the microlens has a refractive index: nD=about 1.60. Because of this, a problem that incident light is reflected at the interface and a light loss is produced occurs. Also in the backside-illuminated CMOS image sensor having a structure (non-cavity structure) having a low refractive index layer formed within a cavity portion, as described in Patent Literature 3, the refractive index of the low refractive index material used therein is 1.4 or less and light loss due to refractive index difference can be reduced but cannot be sufficiently suppressed.

In highly reliable sensors in cars or for interior and exterior monitoring or security, transparency at high temperature is required. In medical sensors, boiling or sterilization/disinfection treatment performed in autoclaves is required and transparency at high temperature must be maintained. In short, from now on, demand for highly functional CMOS image sensors at high temperature is expected. Accordingly, it is expected that transparent filling materials capable of suppressing light loss and maintaining high transparency independent of ambient temperature come to be employed to the usage where operation is required for a long time in severe environments.

However, as a result of intensive studies conducted by the present inventors, it was found that even if resin materials are generally transparent, they cannot maintain transparency at high temperature. In other words, it was found that when resin materials which look transparent at room temperature (for example, 25° C.), are exposed to a high temperature (100° C.), they are no longer transparent.

The present disclosure was made in view of such circumstances, and is directed to providing a resin composition capable of sufficiently overcoming light loss by increasing transparency and refractive index of the resin to be supplied to a cavity portion as mentioned above and capable of maintaining transparency at high temperature.

Solution to Problem

The present disclosure provides a resin composition comprising (a) an acrylic polymer, (b) a compound having at least one (meth)acryloyl group and (c) a polymerization initiator, in which the absolute value of refractive index difference between the component (a) and the component (b) at 100° C. is 0.031 or less. Note that, in the specification, these components will be sometimes referred to simply as the component (a), the component (b), the component (c), etc.

According to the resin composition of the present disclosure, an adhesive layer can be formed over the whole surface of a semiconductor substrate such as a silicon substrate, by imparting adhesiveness to the transparent resin to be supplied to a cavity portion; at the same time, a property satisfactory as a transparent adhesive, i.e., high transparency and high refractive index after curing and transparency even at high temperature, can be maintained.

The present inventors consider the reason why the resin composition disclosed herein has excellent transparency, as follows: with respect to the component (a) and the component (b), the component (a) and the component (b) are selected in such a combination that when they are mixed, dissolved, placed in a space between a glass plate and a silicon plate and cured, the refractive index difference between them falls within the predetermined range as mentioned above. If so, light scattering can be sufficiently suppressed between both components, with the result that no turbidity occurs in the state of liquid and excellent transparency can be maintained.

The present inventors consider the reason why light scattering occurs as follows:

when a resin composition comprising the component (a) and the component (b) is cured, a polymer of the component (b) is produced by a polymerization reaction (for example, radical polymerization) of an acryloyl group. At this time, the component (a) and the polymer derived from the component (b) constitute a sea-island structure, with the result that light is scattered by the boundary between the sea and islands (light does not transmit straight). At this time, it can be recognized that the cured film looks cloudy like ground glass.

If the refractive index difference between the component (a) and the component (b) falls within the predetermined range as mentioned above, light scattering rarely occurs at the boundary surface between the sea and islands. As a result, sufficiently high transparency can be maintained and light loss can be suppressed. Also, according to the resin composition of the present disclosure, it is possible to maintain high transparency even if the composition is exposed to high temperature.

The cause for this was investigated. As a result, it was found that this is caused when the refractive index difference between components of the resin composition increases at high temperature, as shown in the graphs regarding Examples and Comparative Examples described later.

It is preferable that the resin composition further comprises (d) an antioxidant. Owing to the content of the antioxidant, coloration due to deterioration of the resin composition during heating can be suppressed and transparency during heating can be improved.

The (a) acrylic polymer may contain at least one type of structural unit represented by the following formula (I):

[Chemical Formula 1]

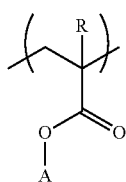

(I)

where A represents an alicyclic group having 5 to 22 carbon atoms optionally having a substituent; and R represents a hydrogen atom or a methyl group.

The (a) acrylic polymer may contain at least one type of structural unit represented by the following formula (II):

[Chemical Formula 2]

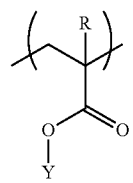

(II)

where Y represents a linear or branched alkyl group having 1 to 10 carbon atoms optionally having a substituent; and R represents a hydrogen atom or a methyl group.

The (a) acrylic polymer may contain at least one type of structural unit represented by the following formula (III):

[Chemical Formula 3]

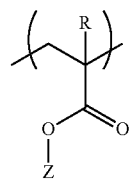

(III)

where Z represents a group containing at least one functional group selected from the group consisting of a carboxyl group, a hydroxyl group, an acid anhydride group, an amino group, an amide group, an epoxy group and a nitrile group; and R represents a hydrogen atom or a methyl group.

The present disclosure provides a resin composition as mentioned above for use in optical parts. The aforementioned resin composition has a large refractive index than air and high transparency and a high refractive index even after cured and can maintain transparency even at high temperature. Accordingly, the composition can be used for optical parts and exerts an excellent effect at the time.

The present disclosure further provides a method for manufacturing a semiconductor device, comprising a step of forming an adhesive layer of the aforementioned resin composition on a semiconductor substrate; a step of sandwiching the adhesive layer between the semiconductor substrate and a transparent substrate and applying pressure onto the semiconductor substrate and the transparent substrate for bonding; and a step of curing the adhesive layer. The aforementioned resin composition has an excellent function as an adhesive and provides highly transparent cured product. Because of this, an excellent effect can be exerted if the resin composition is used in the steps of manufacturing a semiconductor device and the properties of the resultant semiconductor device become satisfactory.

The present disclosure further provides a solid-state imaging element having a semiconductor substrate having a light receiving section provided on the upper surface, an adhesive layer provided on the semiconductor substrate so as to cover the light receiving section and a transparent substrate bonded to the semiconductor substrate by the adhesive layer, in which the adhesive layer is formed of the aforementioned resin composition. Since the solid-state imaging element having such a structure employs the aforementioned resin composition, a structure in which an adhesive layer may be provided in the periphery so as not to cover microlenses and the cavity surrounded by the adhesive layer is filled with the resin composition may be employed. Other than this structure, a structure in which the adhesive layer formed of the resin composition is provided over the whole surface of the substrate can be employed.

Advantageous Effects of Invention

According to the present disclosure, it is possible to provide a resin composition which enables to constitute an adhesive layer over the whole surface of a semiconductor substrate such as a silicon substrate, by imparting adhesiveness to a transparent resin to be supplied to the cavity portion; and which has a satisfactory property as a transparent adhesive, i.e., a property of providing high transparency even after curing and maintaining sufficiently high transparency even if the
S composition is exposed to high temperature.

According to the present disclosure, it is also possible to provide a method for manufacturing a semiconductor device using the aforementioned resin composition and a solid-state imaging element formed of the resin composition.

DESCRIPTION OF EMBODIMENTS

Figure 1:
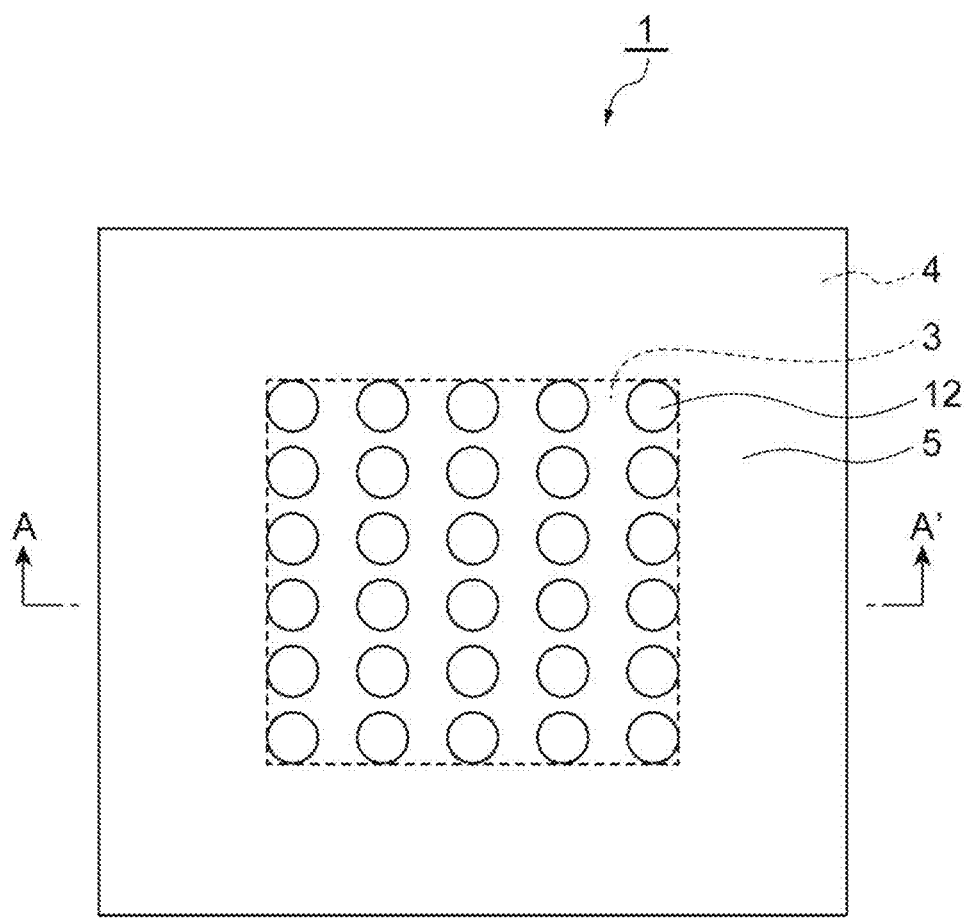
FIG. 1 is a plan view showing a solid-state imaging element according to the embodiment.

Now, preferred embodiments of the present disclosure will be described below; however, the present disclosure is not limited to these embodiments. Note that, in the specification, the "(meth)acryloyl group" refers to an "acryloyl group" or a "methacryloyl group" corresponding thereto. The same applies to other analogous expressions such as (meth)acrylate.

In the specification, the "transparency" means that interaction between a resin composition and visible light rarely occurs and absorption and scattering of electromagnetic waves rarely occur. As the index of "transparency", transmittance is used, which is the intensity ratio of incident light and transmitted light expressed on percentage; however, transparency can be also determined by visual observation of turbidity. The transmittance varies depending upon the wavelength of target light. In the specification, visible light is targeted. The electromagnetic wave corresponding to the visible light has a lower limit wavelength of about 400 nm and an upper limit wavelength of about 760 nm, according to the definition of JIS Z8120.

In the specification, the term "layer" refers to a layer having a structure formed over a whole surface at planer view; however, a layer structure formed on a part of a surface is also included.

In the specification, the term "step" refers not only to an independent step but also a step which cannot be clearly distinguished from another step but can attain a predetermined purpose of the step is included in the term.

In the specification, the numerical range expressed by using "to" refers to the range including the numeric values before and after "to" as the minimum value and the maximum value, respectively. In the specification, in the numerical ranges described stepwise, the upper or lower limit of the numerical range of a certain step may be replaced with the upper or lower limit of the numerical range of another stage. In the numerical range described in the specification, the upper or lower limit of the numerical range thereof can be replaced with values described in Examples.

In the specification, the "refractive index" refers to "relative refractive index", which is the refractive index of an evaluation sample relative to the refractive index of air, which is regarded as 1.000.

In the specification, the "substituent" refers to a halogen atom such as a fluorine atom and a chlorine atom, an alkyl group, an allyl group, an ether group, an ester group, a carboxy group, a cyano group, etc.

<Resin Composition>

The resin composition according to the embodiment comprises (a) an acrylic polymer, (b) a compound having at least one (meth)acryloyl group and (c) a polymerization initiator.

According to an embodiment of the present disclosure, the absolute value of refractive index difference between the component (a) and the component (b) at 100° C. is 0.031 or less, more preferably, 0.030 or less and further preferably 0.028 or less. In the embodiment, the absolute value of refractive index difference between the component (a) and the component (b) at 10° C. is preferably 0.030 or less, more preferably, 0.025 or less and further preferably 0.020 or less.

According to another embodiment of the present disclosure, the absolute value of refractive index difference between the component (a) and the component (b) at 60° C. may be 0.026 or less, is preferably 0.024 or less and is further preferably 0.022 or less. In the embodiment, the absolute value of refractive index difference between the component (a) and the component (b) at 10° C. is preferably 0.030 or less, more preferably 0.025 or less and further preferably 0.020 or less.

<(a) Acrylic Polymer>

The (a) acrylic polymer to be used in the embodiment refers to a polymer constituted of a single acrylic monomer having a single (meth)acryloyl group in a molecule or a copolymer constituted of two types or more acrylic monomers having a single (meth)acryloyl group in a molecule. Note that as long as the effects of the invention are not impaired, a copolymer obtained by copolymerizing a compound which has two or more (meth)acryloyl groups in a molecular or a polymerizable compound having no (meth)acryloyl group (a compound having a single polymerizable unsaturated bond in a molecule, such as acrylonitrile, styrene, vinyl acetate, ethylene, propylene or a compound having two or more polymerizable unsaturated bonds in a molecule, such as divinylbenzene) with an acrylic monomer. In view of this, the acrylic polymer to be used in the embodiment contains an acrylic monomer having a single (meth)acryloyl group in a molecule preferably in an amount of 30 to 100 mass % and more preferably in an amount of 50 to 100 mass % based on the total amount of acrylic polymer.

The component (a) preferably contains a structural unit having an alicyclic group or a linear or branched alkyl group and more preferably contains a structural unit represented by the above formula (I) or a structural unit represented by the above formula(II). Owing to this, absorption of light of a short wavelength (particularly, at wavelength of 400 nm) in the resin composition can be suppressed, with the result that higher transparency tends to be obtained.

The component (a) preferably contains a structural unit having an alicyclic group, more preferably contains a structural unit represented by the above formula (I). Owing to this, heat-resistance tends to be further improved.

The component (a) preferably contains a structural unit having a functional group and more preferably contains a structural unit represented by the above formula (III). Owing to this, excellent stress relaxation due to low elastic modulus, crack resistance, adhesiveness and heat-resistance can be exerted.

In the structural unit represented by the above formula Z may be a glycidyl group. If Z is a glycidyl group, adhesiveness at a reflow process is improved and peeling at the reflow process can be more suppressed.

The content of the structural unit represented by the above formula (III) wherein Z is a glycidyl group is preferably 30 mass % or less, more preferably 2 to 25 mass % and further preferably 4 to 20 mass % based on the total amount of the component (a). If the content is 30 mass % or less, transparency improves, with the result that warp of a wafer caused by stress in a manufacturing process can be more suppressed.

A method for introducing a functional group into an acrylic polymer is not particularly limited; a functional group can be introduced into an acrylic polymer by random copolymerization of a functional group-containing monomer (containing a functional group) by a suspension polymerization such as bead polymerization, granular polymerization and pearl polymerization as well as a conventional method such as solution polymerization, bulk polymerization, precipitation polymerization and emulsion polymerization. Of them, it is preferable to employ a suspension polymerization method for the reason that polymerization can be made at low cost.

The suspension polymerization is carried out in an aqueous solvent by adding a suspension agent. Examples of the suspension agent include water-soluble polymers such as polyvinyl alcohol, methyl cellulose and polyacrylamide, and less-soluble inorganic substances such as calcium phosphate and magnesium pyrophosphate. Of them, a non-ionic water-soluble polymer such as polyvinyl alcohol is preferable. This is because when the non-ionic water-soluble polymer is used, ionic impurities are less likely to remain in the resultant acrylic copolymer. It is preferable that the water-soluble polymer is used in an amount of 0.01 to 1 part by mass relative to the total amount 100 parts by mass of the monomers.

In a polymerization reaction, a general polymerization initiator, a general chain transfer agent, etc., may be used. Examples of the polymerization initiator include the same polymerization initiators, which will be mentioned later as the (c) polymerization initiator. Examples of the chain transfer agent include thiols such as n-octyl mercaptan.

It is preferable that the functional group-containing monomer has at least one group selected from the group consisting of a carboxyl group, an acid anhydride group, a hydroxyl group, an amino group, an amide group, a phosphate group, a cyano group, a maleimide group and an epoxy group in a molecule, and at least one polymerizable carbon-carbon double bond.

It is preferable that the functional group is at least one group selected from the group consisting of an amino group, an amide group, a phosphate group, a cyano group, a maleimide group and an epoxy group in order to avoid problems such as gelation in a varnish state, clogging of a nozzle, etc., when used and occurrence of pinholes during spin coating. It is preferable that the functional group is at least one group selected from the group consisting of a carboxyl group, an acid anhydride group, a hydroxyl group, a phosphate group and an epoxy group in order to more highly prevent coloring. From both points of view, the functional group is more preferably a phosphate group or an epoxy group and further preferably an epoxy group. If the functional group contains an epoxy group, a property of adhesion to a substrate of an inorganic material such as a metal and glass can be more improved.

Examples of the functional group-containing monomer that can be used include carboxyl group-containing monomers such as (meth)acrylic acid and itaconic acid; acid anhydride group-containing monomers such as maleic anhydride acid; hydroxyl group-containing monomers such as 2-hydroxymethyl (meth)acrylate, 2-hydroxyethyl (meth)acrylate, 2-hydroxypropyl (meth)acrylate, N-methylol (meth)acrylamide, o-hydroxystyrene, m-hydroxystyrene and p-hydroxystyrene; amino group-containing monomers such as diethylaminoethyl (meth)acrylate; phosphoric acid group-containing monomers such as 2-(meth)acryloyloxyethyl acid phosphate; vinyl cyanide compounds such as (meth)acrylonitrile; N-substituted maleimides such as N-methylmaleimide, N-ethylmaleimide, N-propylmaleimide, N-i-propylmaleimide, N-butylmaleimide, N butylmaleimide, N-t-butylmaleimide, N-laurylmaleimide, N-cyclohexylmaleimide, N-benzylmaleimide and N-phenylmaleimide; and epoxy group-containing monomers such as glycidyl (meth)acrylate, glycidyl α-ethylacrylate, glycidyl α-n-propylacrylate, 3,4-epoxybutyl (meth)acrylate, 4,5-epoxypentyl (meth)acrylate, 6,7-epoxyheptyl (meth)acrylate, 3-methyl-3,4-epoxybutyl (meth)acrylate, 4-methyl-4,5-epoxypentyl (meth)acrylate, 5-methyl-5,6-epoxyhexyl (meth)acrylate, β-methylglycidyl (meth)acrylate and β-methylglycidyl α-ethylacrylate. These can be used alone or in combination of two or more.

Of them, a glycidyl group-containing monomer such as glycidyl (meth)acrylate can be particularly preferably used. A polymer obtained by using such a monomer, for example, a glycidyl group-containing (meth)acrylic polymer, is preferable to be compatible with an acrylic monomer or oligomer. The glycidyl group-containing (meth)acrylic polymer may be synthesized by a conventional method or may be a commercially available compound. Examples of the commercially available compound include HTR-860P-3 (trade name, Nagase ChemteX Corporation). Such an acrylic polymer is preferable since more excellent crack resistance, adhesiveness and heat-resistance are exerted and storage stability can be ensured.

The amount of a structural unit having a functional group as mentioned above based on the total amount of an acrylic polymer is preferably 0.5 to 6.0 mass %, more preferably 0.5 to 5.0 mass % and particularly preferably 0.8 to 5.0 mass %. If the amount of a structural unit having a functional group falls within the range, adhesive force can be improved; at the same time, gelation can be suppressed.

In the acrylic polymer according to the embodiment, the content of a structural unit having a nitrogen atom-containing group relative to the whole acrylic polymer is preferably 5 mass % or less, more preferably, 3 mass % or less, further preferably 1 mass % or less and particularly preferably 0%. Examples of the aforementioned nitrogen atom-containing group include an amino group, an amido group, a cyano group and a maleimide group. Examples of the structural unit having a nitrogen atom-containing group include a structural unit derived from a monomer containing a nitrogen atom of the aforementioned functional group-containing monomers, more specifically, a vinyl cyanide compound such as (meth)acrylonitrile.

Examples of the monomers to be used in synthesizing the acrylic polymer according to the embodiment other than the functional group-containing monomers include (meth)acrylic acid esters such as methyl (meth)acrylate, ethyl (meth)acrylate, n-propyl (meth)acrylate, i-propyl (meth)acrylate, n-butyl (meth)acrylate, i-butyl (meth)acrylate, t-butyl (meth)acrylate, pentyl (meth)acrylate, n-hexyl (meth)acrylate, 2-ethylhexyl (meth)acrylate, n-octyl (meth)acrylate, dodecyl (meth)acrylate, octadecyl (meth)acrylate, butoxyethyl (meth)acrylate, phenyl (meth)acrylate, benzyl (meth)acrylate and naphthyl (meth)acrylate; aromatic vinyl compounds such as α-methylstyrene, α-ethylstyrene, α-fluorostyrene, α-chlorostyrene, α-bromostyrene, fluorostyrene, chlorostyrene, bromostyrene, methylstyrene, methoxystyrene and styrene; and alicyclic monomers such as cyclopentyl (meth)acrylate, cyclohexyl (meth)acrylate, methylcyclohexyl (meth)acrylate, trimethylhexyl (meth)acrylate, norbornyl (meth)acrylate, norbornylmethyl (meth)acrylate, phenylnorbornyl (meth)acrylate, isobornyl (meth)acrylate, bornyl (meth)acrylate, menthyl (meth)acrylate, fenchyl (meth)acrylate, adamantyl (meth)acrylate, tricyclo[5.2.1.0$^{2,6}$]deca-8-yl (meth)acrylate, tricyclo[5.2.1.0$^{2,6}$]deca-4-methyl (meth)acrylate and cyclodecyl (meth)acrylate. These can be used alone or in combination of two or more.

The content of each of these monomers other than the functional group-containing monomers is not particularly limited; however, the content is preferably controlled such that Tg of the component (a) to be used in the resin composition according to the embodiment falls within the range of −50 to 50° C. For example, if 2.5 mass % of glycidyl methacrylate, 43.5 mass % of methyl methacrylate, 18.5 mass % of ethyl acrylate and 35.5 mass % of butyl acrylate are used as monomer, a glycidyl group-containing acrylic polymer having a Tg of 12° C., serving as the component (a) can be synthesized.

Of the monomers other than the functional group-containing monomers, (meth)acrylic acid esters are preferably used because they easily synthesize a component (a) without gelation. Of the (meth)acrylic acid esters, ethyl (meth)acrylate, butyl (meth)acrylate and 2-ethylhexyl (meth)acrylate are further preferably used because it can be excellently copolymerized with a functional group-containing monomer.

It is preferable that the component (a) contains a structural unit having an alicyclic or heterocyclic structure. Examples of the monomer having an alicyclic or heterocyclic structure for use in producing an acrylic polymer having a structural unit having an alicyclic or heterocyclic structure include the compounds represented by the following formula (1):

[Chemical Formula 4]

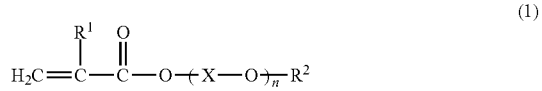

where $R^1$ represents a hydrogen atom or a methyl group; $R^2$ represents an alicyclic group or a heterocyclic group; X represents an alkylene group having 1 to 6 carbon atoms; and n represents an integer of 0 to 10. If n represents an integer of 2 or more, a plurality of X may be mutually the same or different. The alicyclic group herein represents a group having a structure in which carbon atoms are circularly bound; and the heterocyclic group represents a group having a structure in which carbon atoms and 1 or more hetero atoms are circularly bound.

Examples of $R^2$ include the compounds represented by the following formula (2).

[Chemical Formula 5]

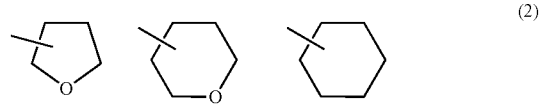

-continued

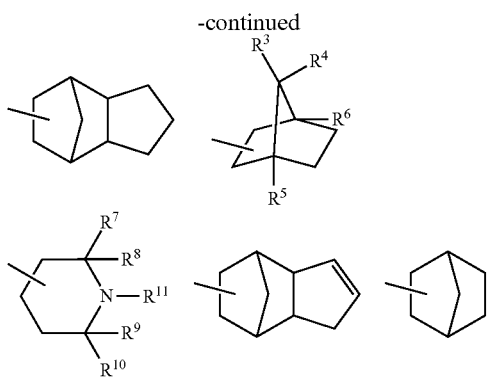

where $R^3$, $R^4$, $R^5$, $R^6$, $R^7$, $R^8$, $R^9$ and $R^{10}$ each independently represent a hydrogen atom or an alkyl group having 1 to 4 carbon atoms; and $R^{11}$ represents a hydrogen atom, an alkyl group having 1 to 4 carbon atoms or a structure represented by $OR^{12}$, in which $R^{12}$ represents a hydrogen atom or an alkyl group having 1 to 8 carbon atoms.

Examples of the compound represented by a formula (1) include cyclohexyl (meth)acrylate, isobornyl (meth)acrylate and tricyclo[5.2.1.0$^{2,6}$]decyl(meth)acrylate.

The content of each of these alicyclic or heterocyclic structure-containing monomers is not particularly limited. For example, if 25.8 mass % of tricyclo[5.2.1.0$^{2,6}$]deca-8-yl acrylate (FA-513A, trade name, manufactured by Hitachi Chemical Co., Ltd.), 20 mass % of butyl acrylate, 31.1 mass % of butyl methacrylate, 18.6 mass % of 2-ethylhexyl methacrylate and 4.5 mass % of glycidyl methacrylate are used, an acrylic polymer having an alicyclic skeleton having a weight-average molecular weight of 100000 or more and containing a glycidyl group can be synthesized.

When a functional group-containing monomer is used in combination, the mixing ratio thereof is determined in consideration of Tg of an acrylic polymer. The Tg is preferably −50° C. or more. If Tg is −50° C. or more, the tackiness of the resin composition in a B-stage state is appropriate and a problem is rarely produced in handling.

When an acrylic polymer containing a structural unit having a functional group is produced by polymerizing the aforementioned monomer, a polymerization method thereof is not particularly limited and methods such as pearl polymerization, solution polymerization and suspension polymerization can be used.

The weight-average molecular weight of the acrylic polymer according to the embodiment is preferably 100000 to 3000000 and more preferably 120000 to 2000000. If the weight-average molecular weight falls within the range, when the acrylic polymer is formed into a sheet or film, the sheet or film will have appropriate strength, flexibility and tackiness. In addition, since the polymer has appropriate flowability, it can be sufficiently filled in a wiring circuit. Note that, in the embodiment, the weight-average molecular weight is measured by gel permeation chromatography (GPC) as described in Examples and represented by a value converted based on the standard polystyrene calibration curve.

The use amount of the acrylic polymer component containing a structural unit having a functional group relative to 100 parts by mass of the following (b) compound having at least one (meth)acryloyl group is preferably 10 to 400 parts by mass. If the use amount falls within the range, more preferable storage elastic modulus is exhibited, flowability during molding can be suppressed and handling at high temperature can be improved. From these points of view, the use amount is more preferably 15 to 350 parts by mass and particularly preferably 20 to 300 parts by mass.

The content of the component (a) relative to 100 parts by mass of the total amount of the component (a) and the component (b) is preferably 35 to 80 parts by mass, more preferably 40 to 75 parts by mass, and further preferably 45 to 70 parts by mass. If the content of the component (a) is 35 parts by mass or more, transparency and peel resistance (crack resistance) during a reflow process improve. Even if the composition is applied to a thin workpiece (e.g., a wafer reduced in thickness), warp can be further suppressed. In contrast, if the content of the component (a) is 80 parts by mass or less, peeling during a reflow time can be suppressed and adhesiveness improves. In addition, when a structure consisting of a substrate and a cured product of the resin composition is divided into pieces, processability of dicing is improved.

<(b) Compound Having at Least One (Meth)Acryloyl Group>

The compound having at least one (meth)acryloyl group according to the embodiment is not particularly limited. Examples of a monofunctional (meth)acrylic monomer include the acrylic monomers as mentioned in the above section of the component (a). Examples of a polyfunctional (meth)acrylic monomer include a polyfunctional (meth)acrylic monomer having an alicyclic skeleton, a polyfunctional (meth)acrylic monomer having an aliphatic skeleton, a polyfunctional (meth)acrylic monomer having a dioxane glycol skeleton and a polyfunctional (meth)acrylic monomer having a functional group. Note that, the term "polyfunctional" herein is used for a (meth)acryloyl group, and means that at least two or more (meth)acryloyl groups are present in a compound.

In order to further improve the transparency of a cured product, a polyfunctional (meth)acrylic monomer having an alicyclic skeleton and a polyfunctional (meth)acrylic monomer having a dioxane glycol skeleton are preferable. In contrast, in order to more effectively suppress a crack of a cured product and peeling thereof from a base material, it is preferable to use a polyfunctional (meth)acrylic monomer having an aliphatic skeleton.

Examples of the polyfunctional (meth)acrylic monomer include the following (meth)acrylic monomers having two (meth)acryloyl groups.

Examples of the (meth)acrylic monomer having two (meth)acryloyl groups include cyclohexane-1,4-dimethanol di(meth)acrylate, cyclohexane-1,3-dimethanol di(meth)acrylate, tricyclodecanedimethylol di(meth)acrylate (for example, KAYARAD R-684: tricyclodecanedimethylol diacrylate, Nippon Kayaku Co., Ltd.), tricyclodecanedimethanol di(meth)acrylate (for example, A-DCP: tricyclodecanedimethanol diacrylate, SHIN-NAKAMURA CHEMICAL CO., LTD.), dioxane glycol di(meth)acrylate (for example, KAYARAD R-604: dioxane glycol diacrylate, Nippon Kayaku Co., Ltd.; and A-DOG: dioxane glycol diacrylate, Shin-Nakamura Chemical Co., Ltd.), neopentyl glycol di(meth)acrylate, dicyclopentanyl di(meth)acrylate, 1,6-hexanediol di(meth)acrylate, ethylene oxide-modified 1,6-hexanediol di(meth)acrylate, neopentyl glycol di(meth)acrylate, (poly)ethylene oxide-modified neopentyl glycol di(meth)acrylate, hydroxypivalic acid neopentyl glycol di(meth)acrylate, polyethylene glycol di(meth)acrylate, polypropylene glycol di(meth)acrylate, ethylene oxide-modified bisphenol A di(meth)acrylate (preferably polyethylene oxide-modified bisphenol A di(meth)acrylate, more preferably ethylene oxide (5 to 15 mol)-modified bisphenol A di(meth)acrylate), and (poly)ethylene oxide-modified phosphoric acid di(meth)acrylate.

Of them, in order to further improve the transparency of a cured product, dioxane glycol diacrylate or tricyclodecanedimethanol diacrylate is more preferable.

Examples of the polyfunctional (meth)acrylic monomer may also include (meth)acrylic monomers having 3 (meth) acryloyl groups, such as pentaerythritol tri(meth)acrylate, ethylene oxide-modified isocyanuric acid tri(meth)acrylate; and (meth)acrylic monomers having 6 (meth)acryloyl groups, such as dipentaerythritol hexaacrylate.

<(c) Polymerization Initiator>

As the (c) polymerization initiator according to the embodiment, for example, either one or both of (c1) a thermal polymerization initiator and (c2) a photopolymerization initiator can be used. Since the curing reaction of the resin composition according to the embodiment proceeds more uniformly and the adhesive strength thereof is further improved, it is more preferable to comprise (c1) a thermal polymerization initiator.

Examples of the (c1) thermal polymerization initiator include organic peroxides such as t-hexyl peroxypivalate (PERHEXYL PV, trade name; one hour half-life temperature 71.3° C., 10 hours half-life temperature 53.2° C.), dilauroyl peroxide (PERHEXYL L, trade name; one hour half-life temperature 79.3° C., 10 hours half-life temperature 61.6° C.), di(3,5,5-trimethylhexanoyl)peroxide (PERLOYL 355, trade name; one hour half-life temperature 76.8° C., 10 hours half-life temperature 59.4° C.), 1,1,3,3-tetramethylbutylperoxy-2-ethyl hexanoate (PEROCTA O, trade name; one hour half-life temperature 84.4° C., 10 hours half-life temperature 65.3° C.), t-butylperoxy-2-ethyl hexanoate (PERBUTYL O, trade name; one hour half-life temperature 92.1°° C., 10 hours half-life temperature 72.1° C.), benzoyl peroxide+water (NYPER BW, trade name; one hour half-life temperature 92.0° C., 10 hours half-life temperature 73.6° C.), 1,1-di(t-hexylperoxy)-3,3,5-trimethylcyclohexane (PERHEXA TMH, trade name; one hour half-life temperature 106.4° C., 10 hours half-life temperature 86.7° C.), 1,1-di(t-hexylperoxy)cyclohexane (PERHEXA HC, trade name; one hour half-life temperature 107.3° C., 10 hours half-life temperature 87.1° C.), t-hexylperoxyisopropyl monocarbonate (PERHEXYL I, trade name; one hour half-life temperature 114.6° C., 10 hours half-life temperature 95.0° C.), t-butylperoxyisopropyl monocarbonate (PERBUTYL I, trade name; one hour half-life temperature 118.4° C., 10 hours half-life temperature 98.7° C.), dicumyl peroxide (PERCUMYL D, trade name; one hour half-life temperature 135.7° C., 10 hours half-life temperature 116.4° C.), and n-butyl 4,4-bis(t-butylperoxy) valerate (PERHEXA V trade name; one hour half-life temperature 126.5° C., 10 hours half-life temperature 104.5° C.); and azo compounds such as 2,2'-azobisisobutyronitrile, 1,1'-(cyclohexane-1,1-carbonitrile)-2,2'-azobis(2-cyclopropylpropionitrile) and 2,2'-azobis(2,4-dimethylvaleronitrile).

These thermal polymerization initiators can be used alone or in combination of two or more.

Of these thermal polymerization initiators, an organic peroxide is preferable since the effect of improving the physical properties of a cured product is larger; and an organic peroxide having a 10 hours half-life temperature of 90 to 150° C. is more preferable since the balance between handling such as shelf life and pot life of the resin composition and curing is more satisfactorily maintained.

The blending amount of the component (c1) relative to 100 parts by mass of the total amount of the component (a) and the component (b) is preferably 0.1 to 30 parts by mass, more preferably 0.2 to 20 parts by mass and further preferably 0.5 to 10 parts by mass.

Note that the half-life temperature of an organic peroxide is measured as follows.

An organic peroxide solution, which is prepared so as to have a concentration of 0.1 mol/L with benzene used as a solvent, is sealed in a glass tube purged with nitrogen. The glass tube is soaked in a thermostatic bath set at a predetermined temperature to carry out thermal decomposition. Generally, decomposition of an organic peroxide in a diluted solution can be approximately treated as a primary reaction. Thus, assuming that the amount of decomposed organic peroxide is represented by x (mol/L), the decomposition rate constant by k (1/h), time by t (h) and the initial organic peroxide concentration by a (mol/L), the following formula (1) and formula (2) are established.

$$dx/dt = k(a-x) \quad (1)$$

$$\ln\{a/(a-x)\} = kt \quad (2)$$

Since the half-life is a time period required until the initial concentration of organic peroxide to be decomposed is reduced by half, the half-life is represented by t½ and x of formula (2) is substituted by a/2, the following formula (3) is obtained.

$$kt\frac{1}{2} = \ln 2 \quad (3)$$

Accordingly, if the thermal decomposition is carried out at a constant temperature; time (t) and value of ln {a/(a−x)} are plotted to obtain a linear line showing a relationship between them; and a value k is obtained from the inclination of the line, the half-life (t½) at the temperature can be obtained in accordance with formula (3).

On the other hand, as to the decomposition rate constant k, provided that the frequency factor is represented by A (1/h), the activation energy by E (J/mol), the gas constant by R (8.314 J/mol·K) and the absolute temperature by T (K), the following formula (4) is established.

$$\ln k = \ln A - \Delta E/RT \quad (4)$$

From formula (3) and formula (4), k is deleted to obtain the following formula (5):

$$\ln(t\frac{1}{2}) = \Delta E/RT - \ln(A/2) \quad (5)$$

Herein, t½ is obtained with respect to several temperature values. Values of ln (t½) and 1/T are plotted to obtain a linear line showing the relationship of them. From the linear line, temperature (one hour half-life temperature) at t½=1 h can be obtained. Similarly, 10 hours half-life temperature can be obtained assuming that t½=10 h.

Examples of a preferable organic peroxide of the thermal polymerization initiators mentioned above include dicumyl peroxide (PERCUMYL D) and n-butyl 4,4-bis(t-butylperoxy)valerate (Perhexa V).

Note that a thermal polymerization initiator, if it is used in combination with the component (a) and the component (b), exhibits excellent heat-resistance, peeling resistance and stress relaxation and further improves the reliability of optical parts.

Examples of the (c2) photopolymerization initiator include acylphosphine oxides, oxime esters, aromatic ketones, quinones, benzoin ether compounds, benzyl derivatives, 2,4,5-triarylimidazole dimers, acridine derivatives, coumarin compounds and N-phenylglycine derivatives. Note that, the (c2) photopolymerization initiator to be used in the embodiment may be synthesized by a conventional method or may be a commercially available compound.

Of these, in consideration of further improvement of photo-crosslinking, sensitivity and the transparency of the cured film, acylphosphine oxides and oxime esters are preferable.

Note that the (c2) photopolymerization initiators can be used alone or in combination of two or more.

Examples of the acylphosphine oxides include bis(2,4,6-trimethylbenzoyl)-phenylphosphine oxide (trade name: IRGACURE-819, BASF) and 2,4,6-trimethylbenzoyl-diphenylphosphine oxide (trade name: LUCIRIN TPO, BASF).

Examples of the oxime esters include 1,2-octanedione-1-[4-(phenylthio)phenyl-2-(O-benzoyloxime)] (trade name: IRGACURE-OXE01, BASF), 1-[9-ethyl-6-(2-methylbenzoyl)-9H-carbazol-3-yl]ethanone-1-(O-acetyl oxime) (trade name: IRGACURE-OXE02, BASF) and 1-phenyl-1,2-propanedione-2-[o-(ethoxycarbonyl)oxime] (trade name: Quantacure-PDO, Nippon Kayaku Co., Ltd.).

Examples of the aromatic ketones include, benzophenone, N,N,N',N'-tetramethyl-4,4'-phenone (Michler's ketone), N,N,N,N',N'-tetraethyl-4,4'-diaminobenzophenone, 4-methoxy-4'-dimethylaminobenzophenone, 2,2-dimethoxy-1,2-diphenylethan-1-one (trade name: IRGACURE-651, BASF) 2-benzyl-2-dimethylamino-1-(4-morpholinophenyl)-butan-1-one (trade name: IRGACURE-369, BASF), 2-methyl-1-[4-(methylthio)phenyl]-2-morpholinopropan-1-one (trade name: IRGACURE-907, BASF) and 2-hydroxy-1-{4-[4-(2-hydroxy-2-methyl-propionyl)-benzyl]phenyl}-2-methyl-propan-1-one (trade name: IRGACURE-127, BASF).

Examples of the quinones include 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone.

Examples of the benzoin ether compounds include benzoin methyl ether, benzoin ethyl ether and benzoin phenyl ether.

Examples of the benzyl derivatives include benzoin compounds such as benzoin, methyl benzoin and ethyl benzoin; and benzyldimethylketal.

Examples of the 2,4,5-triarylimidazole dimers include 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer. Examples of the 2-(o-chlorophenyl)-4,5-diphenylimidazole dimer include 2-(2-chlorophenyl)-1-[2-(2-chlorophenyl)-4,5-diphenyl-1,3-diazol-2-yl]-4,5-diphenylimidazole.

Examples of the acridine derivatives include 9-phenyl acridine and 1,7-bis(9,9'-acridinyl)heptane.

Examples of the coumarin compounds include 7-amino-4-methylcoumarin, 7-dimethylamino-4-methylcoumarin, 7-diethylamino-4-methylcoumarin, 7-methylamino-4-methylcoumarin, 7-ethylamino-4-methylcoumarin, 7-dimethylamino cyclopenta[c]coumarin, 7-aminocyclopenta[c]coumarin, 7-diethylaminocyclopenta[c] coumarin, 4,6-dimethyl-7-ethylaminocoumarin, 4,6-diethyl-7-ethylaminocoumarin, 4,6-dimethyl-7-di ethylaminocoumarin, 4,6-dimethyl-7-dimethylaminocoumarin, 4,6-diethyl-7-ethylaminocoumarin, 4,6-diethyl-7-dimethylaminocoumarin, 2,3,6,7,10,11-hexanehydro-1H, 5H-cyclopenta[3,4][1]benzopyrano-[6,7,8-ij]quinolizine 12 (9H)-on, 7-di ethyl amino-5',7'-dimethoxy-3,3'-carbonyl biscoumarin, 3,3'-carbonylbis[7-(diethylamino)coumarin] and 7-diethylamino-3-thienoxylcoumarine.

Examples of N-phenylglycine derivatives include N-phenylglycine, N-phenylglycine butyl ester, N-p-methylphenylglycine, N-p-methylphenylglycine methyl ester, N-(2,4-dimethylphenyl)glycine and N-methoxyphenyl glycine.

The blending amount of the (c2) photopolymerization initiator relative to 100 parts by mass of the total amount of the component (a) and the component (b) is preferably 0.1 to 20 parts by mass, more preferably 0.5 to 10 parts by mass and further preferably 0.75 to 5 parts by mass. If the blending amount falls within the aforementioned range, foaming, turbidity, coloring and crack of the cured product can be more highly prevented.

<Organic Solvent>

The resin composition according to the embodiment is prepared in a state like vanish by dissolving or dispersing other than components (a), (b), and (c), and, if necessary, an optional component(s) (described later) in an organic solvent. In this manner, the coating properties of the adhesive composition to a base material are improved, thereby improving workability.

The organic solvent to be used for obtaining a state like a varnish is not limited as long as the components of the resin composition are homogeneously stirred, mixed, melted, kneaded or dispersed, and solvents known in the art can be used. Examples of the organic solvent to be used, include, are not particularly limited to, alcohols, ethers, ketones, amides, aromatic hydrocarbons, esters and nitriles. More specifically, in consideration of volatility at low temperatures, low-boiling point solvents may be mentioned, which include diethyl ether, acetone, methanol, tetrahydrofuran, hexane, ethyl acetate, ethanol, methyl ethyl ketone and 2-propanol. In order to improve stability of a coating film, etc., high-boiling point solvents may be mentioned, which include toluene, methyl isobutyl ketone, 1-butanol, 2-methoxyethanol, 2-ethoxyethanol, xylene, N,N-dimethylacetamide, N,N-dimethylformamide, cyclohexanone, dimethyl acetamide, butyl cellosolve, dimethyl sulfoxide, propylene glycol monomethyl ether acetate, N-methyl-2-pyrrolidone and γ-butyrolactone. These organic solvents can be used alone or in combination of two or more.

Of these, propylene glycol monomethyl ether acetate, methyl ethyl ketone, cyclohexanone, etc., are preferably used since they have an excellent solubility and a high drying rate.

The amount of organic solvent to be used in the resin composition according to the embodiment is determined by viscosity, etc., of a mixture like a vanish. The amount of organic solvent, which is not particularly limited, is preferably falls within the range of about 5 to 95 mass %, and more preferably 10 to 90 mass % relative to the whole resin composition.

<(d) Antioxidant>

To the resin composition according to the embodiment, if necessary, an antioxidant can be added. Examples of the antioxidant to be used in the embodiment include a phenolic antioxidant and a thioether antioxidant.

It is preferable that the amount of antioxidant to be used in the resin composition according to the embodiment relative to 100 parts by mass of the total amount of components (a), (b) and (c) is 0.01 to 10 parts by mass.

<Coupling Agent>

To the resin composition according to the embodiment, a coupling agent (adhesion aid) can be added. Examples of the coupling agent to be used include, but are not particularly limited to, various coupling agents such as a silane coupling agent, a titanate coupling agent, an aluminum coupling agent, a zirconate coupling agent and a zircoaluminate coupling agent.

Examples of the silane coupling agent include methyltrimethoxysilane, methyltriethoxysilane, phenyltrimethoxysilane, phenyltriethoxysilane, vinyltrimethoxysilane, vinyltriethoxysilane, vinyltriacetoxysilane, vinyl-tris(2-methoxyethoxy)silane, γ-methacryloxytrimethoxysilane, γ-methacryloxypropylmethyl dimethoxysilane, methyltri (methacryloxyethoxy)silane, γ-acryloxypropyltrimethoxysilane, γ-aminopropyltrimethoxysilane, γ-aminopropyltriethoxysilane, N-β-(aminoethyl)-γ-aminopropyltrimethoxysilane, N-β-(aminoethyl)-γ-aminopropylmethyldimethoxysilane, N-β-(N-vinylbenzylaminoethyl)-γ-aminopropyltrimethoxysilane, γ-anilinopropyltrimethoxysilane, γ-ureidopropyltrimethoxysilane, γ-ureidopropyltriethoxysilane, 3-(4,5-dihydroimidazolyl)propyltriethoxysilane, β-(3,4-epoxycyclohexyl)ethyltrimethoxysilane, γ-glycidoxypropyltrimethoxysilane, γ-glycidoxypropylmethyldiethoxysilane, γ-glycidoxypropylmethyldiisopropenoxysilane, methyltriglycidoxysilane, γ-mercaptopropyltrimethoxysilane, γ-mercaptopropyltriethoxysilane, γ-mercaptopropylmethyldimethoxysilane, trimethylsilylisocyanate, dimethylsilylisocyanate, phenylsilyltriisocyanate, tetraisocyanatesilane, methylsilyltriisocyanate, vinylsilyltriisocyanate and ethoxysilanctriisocyanate.

Examples of the titanate coupling agent include isopropyltriisostearoyl titanate, isopropyltridodecylbenzenesulfonyl titanate, isopropyltris(dioctylpyrophosphate) titanate, tetraisopropylbis(dioctylphosphite) titanate, tetraoctylbis (ditridecylphosphite) titanate, tetra(2,2-diallyloxymethyl-1-butyl)bis(ditridecyl)phosphite titanate, bis(dioctylpyrophosphate)oxyacetate titanate, bis(dioctylpyrophosphate) ethylene titanate, isopropyltrioctanoyl titanate, isopropyldimethacrylisostearoyl titanate, isopropyl(dioctylphosphate) titanate, isopropyltricumyiphenyl titanate, isopropyltri(N-aminoethylamainoethyl) titanate, dicumyiphenyloxyacetate titanate and diisostearoylethylene titanate.

Examples of the aluminum coupling agents include acetoalkoxyaluminum diisopropionate.

Examples of the zirconate coupling agents include tetrapropyl zirconate, tetrabutyl zirconate, tetra(triethanolamine) zirconate, tetraisopropyl zirconate, zirconium acetylacetonateacetylacetonezirconium butyrate, and stearic acid zirconium butyrate.

Examples of the zircoaluminate coupling agent include the compounds represented by the following formula (6):

[Chemical Formula 6]

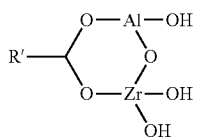

(6)

where R' represents a carboxyl group or an amino group.

Examples of the compound where R' represents a carboxyl group include Manchem CPG-carboxy zircoaluminate. Examples of the compound where R' represents an amino group include a Manchem APO-X-amino zircoaluminate solution. They are each available from Rhone-Poulenc Inc.

The blending amount of the coupling agent relative to 100 parts by mass of the total amount of components (a), (b) and (c) is preferably 0.1 to 20 parts by mass and particularly preferably 1 to 15 parts by mass. If the blending proportion is 0.1 part by mass or more, adhesive strength tends to further improve. In contrast, if the blending proportion is 20 parts by mass or less, the content of a volatile matter is lower and voids tend to be rarely formed in the cured product.

Among these coupling agents, it is preferable to select a silane coupling agent since it is effective in improving coupling of materials at the interface or wettability.

<Filler>

To the resin composition according to the embodiment, if necessary, a filler may be added. Types of fillers include an inorganic filler, an organic filler, etc. In order to improve heat-resistant or thermal conductivity, or control melt viscosity or provide thixotropy, an inorganic filler is preferable.

Examples of the inorganic filler include, but are not particularly limited to, aluminum hydroxide, magnesium hydroxide, calcium carbonate, magnesium carbonate, calcium silicate, magnesium silicate, calcium oxide, magnesium oxide, aluminum oxide, aluminum nitride, titanium oxide, zirconium oxide, cerium oxide, zinc oxide, aluminum borate whisker, boron nitride, crystalline silica, amorphous silica and antimony oxide. These can be used alone or in combination of two or more.

In order to improve thermal conductivity, aluminum oxide, aluminum nitride, boron nitride, crystalline silica, amorphous silica, etc., are preferable. To control melt viscosity or provide thixotropy, aluminum hydroxide, magnesium hydroxide, calcium carbonate, magnesium carbonate, calcium silicate, magnesium silicate, calcium oxide, magnesium oxide, aluminum oxide, crystalline silica, amorphous silica, etc., are preferable.

In order to further improve transparency and workability, it is preferable that the blending amount of filler is 3 mass % or less of the total resin composition excluding a solvent.

When a varnish is produced by adding a filler to the resin composition according to the embodiment, the vanish is sufficiently dispersed by applying physical shearing force by a means such as a grinder, 3-rolls, a ball mill and a bead mill so as not to remain secondary agglomerated particles, and then put in use. The aforementioned dispersion methods can be used in combination.

The duration of mixing components can be reduced by previously mixing a filler and a low molecular weight substance(s) and then adding a high molecular weight substance(s) to the mixture.

Example of a method of homogeneously stirring and mixing individual components include, but are not particularly limited to, a method of using a rotation revolution stirrer such as a dissolver, a static mixer, a homogenizer, an ultrasonic homogenizer, a paint shaker, a ball mill, a planetary mixer, a mixing rotor and a universal agitator, and a method of using a kneader such as a stone-mill and 3-rolls. These methods can be appropriately used in combination. After a mixture is obtained in a state like a varnish, it is preferable to remove air bubbles in the vanish-like mixture. In view of this, the rotation revolution stirrer, which simultaneously carries out mixing, dissolution and removal of air bubbles, is preferably employed.

To the resin composition according to the embodiment, if necessary, further a hygroscopic agent such as calcium oxide and magnesium oxide; a wettability improving agent such as a fluorine-containing surfactant, a nonionic surfactant and a higher fatty acid; a defoamer such as silicone oil; and an ion trapping agent such as an inorganic ion exchanger may be appropriately added alone or in combination of several types of agents.

Note that, the content of nitrogen is preferably 8 mass % or less, and more preferably 5 mass % or less based on the whole resin composition according to the embodiment, excluding a solvent. It is preferable that the content of nitrogen falls within the range, because coloring due to nitrogen oxide can be highly suppressed.

<Method for Manufacturing a Semiconductor Device>

The method for manufacturing a semiconductor device according to the embodiment, comprises a step of forming an adhesive layer (hereinafter referred to also as "adhesive resin layer") of the aforementioned resin composition according to the embodiment on a semiconductor substrate (adhesive layer formation step); a step of sandwiching the adhesive layer between the semiconductor substrate and a transparent substrate and applying pressure onto the semiconductor substrate and the transparent substrate for bonding (press-bonding step); and a step of curing the adhesive layer (curing step).

(Adhesive Layer Formation Step)

For the adhesive layer formation step, a method of applying the resin composition according to the embodiment onto a semiconductor substrate or a method of attaching a resin composition in a film form to a semiconductor substrate can be employed. The semiconductor substrate is either one of a semiconductor wafer and a semiconductor device (semiconductor chip).

As the method of applying the resin composition, a dispensing method, a spin coating method, die coating method, a knife coating method, etc., may be mentioned. In particular, a spin coat method or a die coating method, which is suitable for application of the composition comprising a high molecular weight compound is preferable.

When the method of attaching a resin composition in a film form is employed, in order to ensure sufficient wetting and spreading thereof, it is preferable to laminate the adhesive composition in a film form within the range of 0 to 90° C. To uniformly bond the adhesive composition in a film form, it is preferable to employ lamination by use of a roll.

A method of producing a resin composition in a film form will be described below. The resin composition according to the embodiment is uniformly applied to a support film and heated in the conditions in which the solvent used herein is sufficiently volatilized, for example, at a temperature of 60 to 200° C. for 0.1 to 30 minutes, to form the resin composition in a film form. At this time, in order to obtain a resin composition in a film form having a desired thickness, the amount of solvent in the resin composition, viscosity thereof, the initial thickness of the coating (when a coater such as a die coater and a comma coater is used, the gap between the coater and a support film is controlled), drying temperature, air flow, etc., are controlled.

It is preferable that the support film is flat. Since a support film such as a PET film has highly adhesive due to static attraction, a smoothing agent is sometimes used in order to improve workability. Depending upon the type of smoothing agent and temperature, minor projections and depressions are transferred to the adhesive and the degree of flatness may sometimes decrease. Accordingly, it is preferable to use a support film to which a smoothing agent is not applied or a support film having a low amount of smoothing agent applied. A support film such as a polyethylene film is preferable in view of excellent flexibility; however, the thickness and density of the support film is appropriately selected such that marks of a roll, etc., used in lamination are not transferred to the surface of an adhesive layer.

(Press-Bonding Step)

In the next step, the adhesive layer formed on the semiconductor substrate, if desired, heated and dried. The drying temperature is not particularly limited. If components are dissolved or dispersed in a solvent to prepare a mixture like a varnish, it is preferable that the drying temperature is lower by 20 to 60° C. than the boiling point of the solvent used herein. This is preferable because the solvent is not bubbled during drying and air bubbles are not formed. For the reason, the drying temperature is lower more preferably by 25 to 55° C. and further preferably by 30 to 50° C. than the boiling point of the solvent to be used.

In the case where components are dissolved or dispersed in a solvent to prepare a mixture like varnish, it is particularly preferable that the remaining amount of solvent is reduced as much as possible because formation of air bubbles due to bubbling of the solvent after curing is avoided.

The duration of heat-drying is not particularly limited as long as the solvent used there is sufficiently volatilized and the component (c) does not substantially generate radicals. The heat-drying is usually performed by heating at 40 to 100° C. for 0.1 to 90 minutes. Note that, the phrase "does not substantially generate radicals" means that no radicals are generated or means that if radicals are generated, the amount of radicals is extremely low enough to prevent proceeding of a polymerization reaction or even if a polymerization reaction proceeds, the physical properties of the adhesive layer are not affected. It is preferable that drying is carried out under reduced pressure, because radical generation from the component (c) by heating is suppressed as well as the remaining amount of the solvent can be reduced.

In order to suppress peeling of the adhesive layer during a solder-reflow process due to bubbles generated during heat-curing of the adhesive layer, it is preferable to sufficiently reduce the amount of volatile components present within or on the adhesive layer, such as a residual solvent, low molecular weight impurities, a reaction product(s), a decomposition product(s), a water derived from materials and water adsorbed to a surface.

After the heat-drying, a transparent substrate is bonded onto the adhesive layer by application of pressure.

Note that, the heat-drying can be omitted when a method of bonding a resin composition in a film form is employed in the adhesive layer formation step.

(Curing Step)

After the semiconductor substrate and the transparent substrate are bonded by application of pressure with the adhesive layer interposed between them, the adhesive layer is cured. As a curing method, curing with application of heat or light, or curing with application of heat and light is mentioned; however, curing with heat is particularly preferable.

In the curing step of forming a cured product of the adhesive layer, it is preferable that curing is performed for one to two hours while selecting temperature and increasing temperature step by step. It is preferable that the curing is performed within the range of 100 to 200° C.

Note that, it is not necessary that the press-bonding step and curing step are independent steps. Curing can be simultaneously carried out while press-bonding.

<Physical Properties of Cured Product of Adhesive Layer>

The Tg of the cured product of the adhesive layer according to the embodiment having the aforementioned composition is preferably −10° C. or more and more preferably 0° C. or more.

The elastic modulus at 25° C. of the cured product of the adhesive layer according to the embodiment is preferably 0.01 GPa or more, more preferably 0.1 GPa or more and further preferably 0.5 GPa or more. Note that, the upper limit of the elastic modulus at 25° C., which is not particularly limited, is preferably 10 GPa or less from a practical point of view.

<Optical Parts>

The optical parts according to the embodiment have a non-cavity structure using the aforementioned resin composition. Now, the backside-illuminated structure of a solid-state imaging element, will be described as an example of the optical parts according to the embodiment, if necessary, referring to the accompanying drawings.

FIG. 1 is a plan view showing a solid-state imaging element according to the embodiment. As shown in FIG. 1, a CMOS image sensor 1 according to the embodiment has a sensor section 3 (also referred to as a "light receiving section 3") having a plurality of microlenses 12 arranged therein, at a center region. Around the sensor section 3, a peripheral circuit section 4 is present, in which a circuit is formed. Further, a glass substrate 5 is provided so as to cover at least the sensor section 3.

Figure 2:
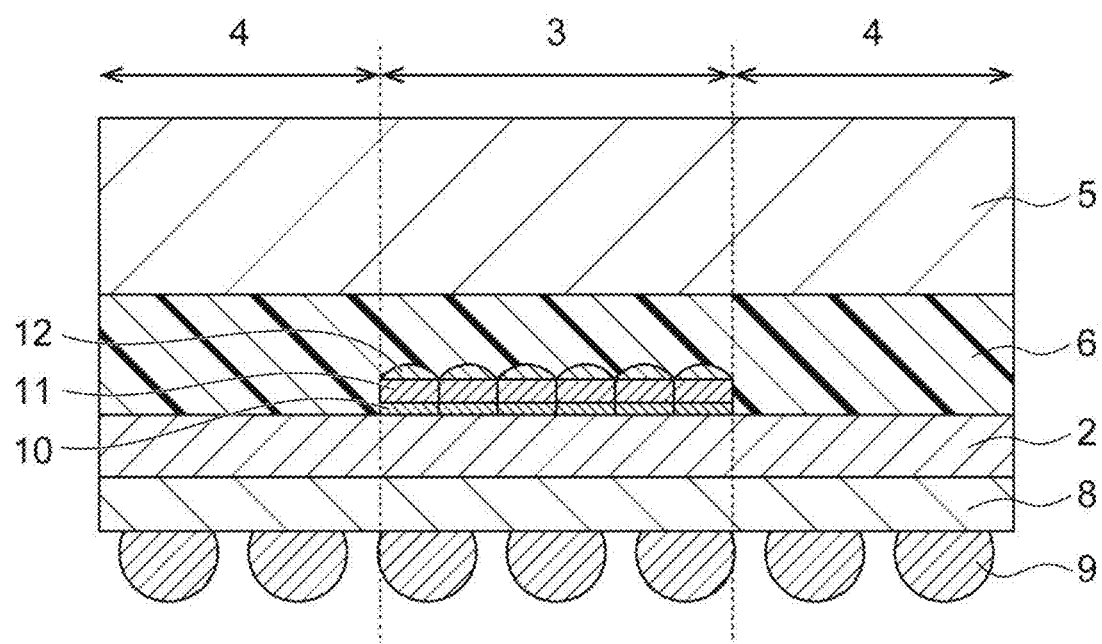
FIG. 2 is a sectional view along the A-N line of FIG. 1.

FIG. 2 is a sectional view along the A-A' line of FIG. 1. As shown in FIG. 2, on one of the surfaces of a silicon substrate 2, a plurality of photodiodes 10 are formed. On the upper surface of each of the photodiode 10, a color filter 11 is provided so as to cover at least the photodiode 10. On the upper surface of the color filter 11, a microlens 12 is formed. The color filter 11 is provided to every photodiode 10 and individual microlenses 12 are provided at the positions corresponding to the color filters 11 respectively. An adhesive layer 6 formed of the resin composition according to the embodiment is formed over the whole surface of the silicon substrate 2 on which the microlenses 12 are formed. On a surface of the adhesive layer 6, a glass substrate 5 is provided. Likewise, a structure having no cavity portion (non-cavity structure) is formed. On the other surface of the silicon substrate 2, a wiring layer 8 is arranged. On the lower surface of the wiring layer 8, solder balls 9 are provided.

Figure 3:
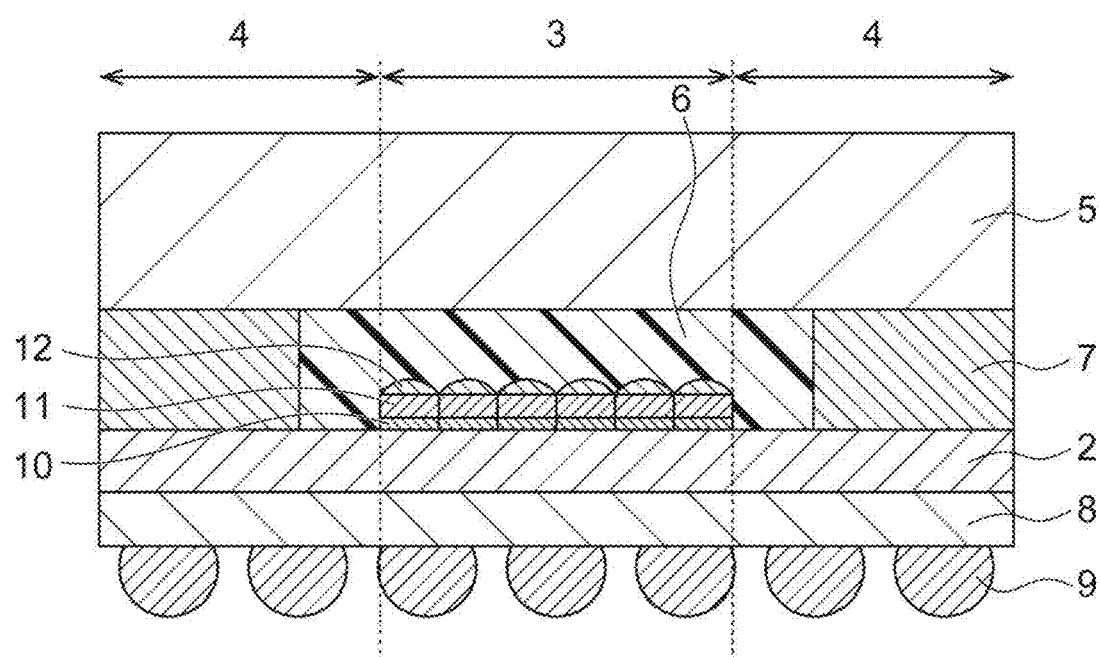
FIG. 3 is a sectional view showing another solid-state imaging element according to the embodiment.

FIG. 3 is a sectional view showing another solid-state imaging element according to the embodiment. In FIG. 3, on the surface of the silicon substrate 2 where the microlenses 12 are provided, a frame-like adhesive layer 7 is provided in the periphery so as not to cover the microlenses 12. On the upper surface of the frame-like adhesive layer 7, the glass substrate 5 is arranged. The portion surrounded by the silicon substrate 2, the frame-like adhesive layer 7 and the glass substrate 5 is filled with the resin composition according to the embodiment to form the adhesive layer 6, with the result that a non-cavity structure is formed. In the solid-state imaging element according to the embodiment shown in FIG. 3, the adhesive layer 6 serves not only as an adhesive for bonding the silicon substrate 2 and the glass substrate 5 but also as a sealing material to seal the microlenses 12, color filters 11 and the photodiodes 10 by filling the cavity portion.

In a conventional non-cavity structure, an adhesive rib (hereinafter referred to simply as the "rib") is formed so as to surround a light receiving section, and thereafter, the light receiving section is filled with a transparent sealing material to bond to a transparent substrate (for example, glass) for sealing. In the non-cavity structure shown in FIG. 3, an adhesive rib (the frame-like adhesive layer 7) is formed, and thereafter, the cavity portion is filled with the resin composition according to the embodiment to form the adhesive layer 6. In the non-cavity structure manufactured in this manner, other portions except the rib are sufficiently adhesive, with the result that more highly reliable non-cavity structure can be obtained. In contrast, in the non-cavity structure shown in FIG. 2, a rib is not formed and the silicon substrate 2 and the glass substrate 5 having transparency are bonded via the adhesive layer 6 formed of the resin composition according to the embodiment. This is because the resin composition according to the embodiment can serve as an adhesive and a sealing material. In this non-cavity structure shown in FIG. 2, compared to the non-cavity structure shown in FIG. 3, formation of a rib is not required and a non-cavity structure can be easily formed. In addition, instruments such as a printer, an exposure machine and a developer required for forming a rib are not required.

Figure 4:
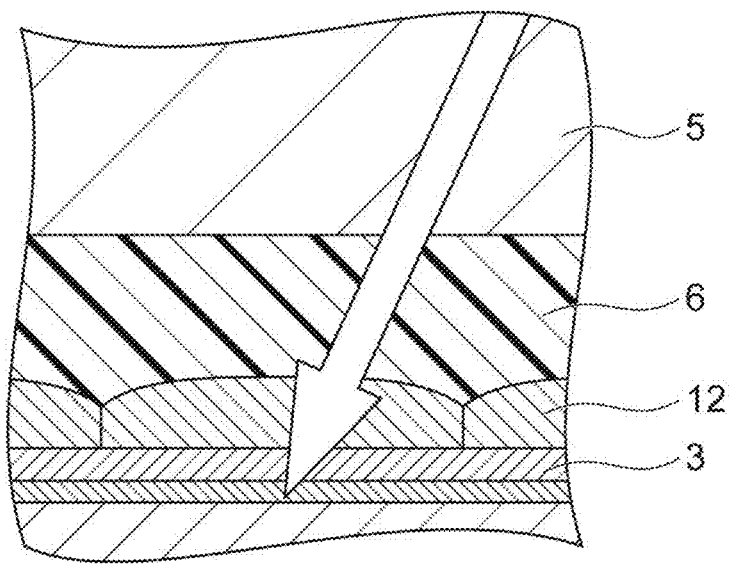
FIG. 4 is a sectional view of a non-cavity structure.
Figure 5:
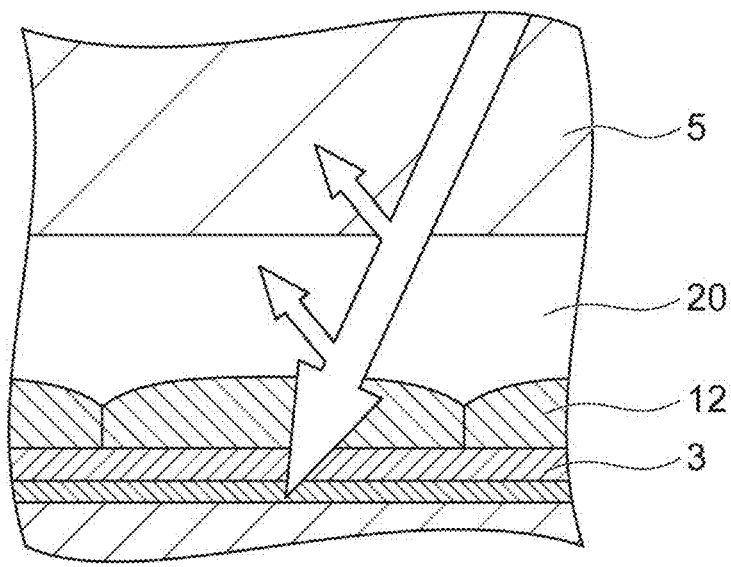
FIG. 5 is a sectional view of a cavity structure.

FIG. 4 and FIG. 5 each illustrate refraction at the interface of cavity portions of a non-cavity structure and a cavity structure, which differ in refractive-index. Assuming that the glass substrate 5 has a refractive index, nD=about 1.47, an air layer 20 of a cavity portion has a refractive index, nD=about 1.00, the microlens 12 has a refractive index, nD=about 1.60, and the adhesive layer 6 has a refractive index, nD=about 1.50, the light loss by interface reflection of the non-cavity structure shown in FIG. 4 is calculated to be lower by about 8% than that of the cavity structure shown in FIG. 5. The refractive index value of the resin composition to be used in the embodiment is generally nD=around 1.50.

Figure 6:
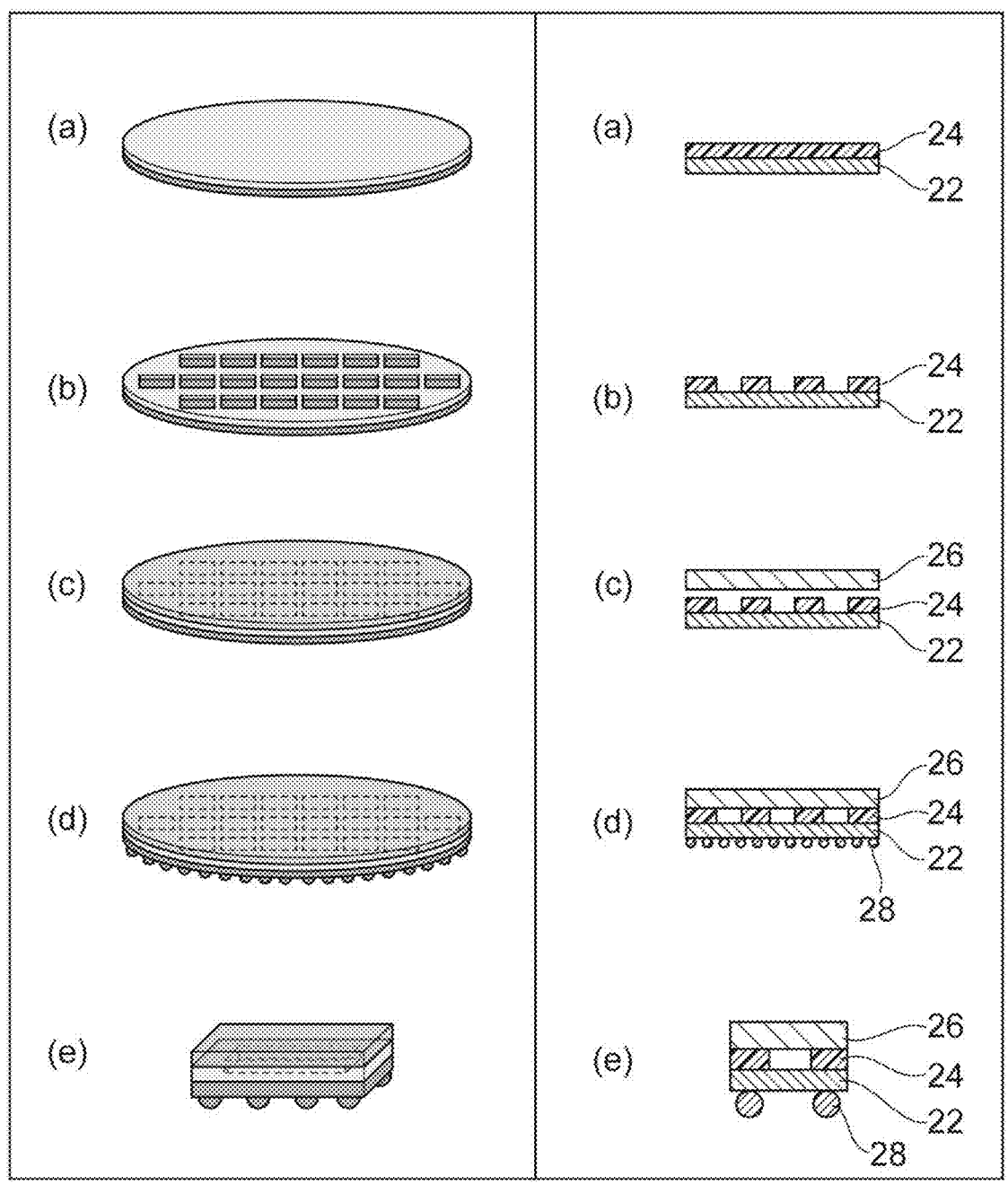
FIG. 6 shows a process drawing illustrating the steps of a method for manufacturing a solid-state imaging element having a cavity structure.
Figure 7:
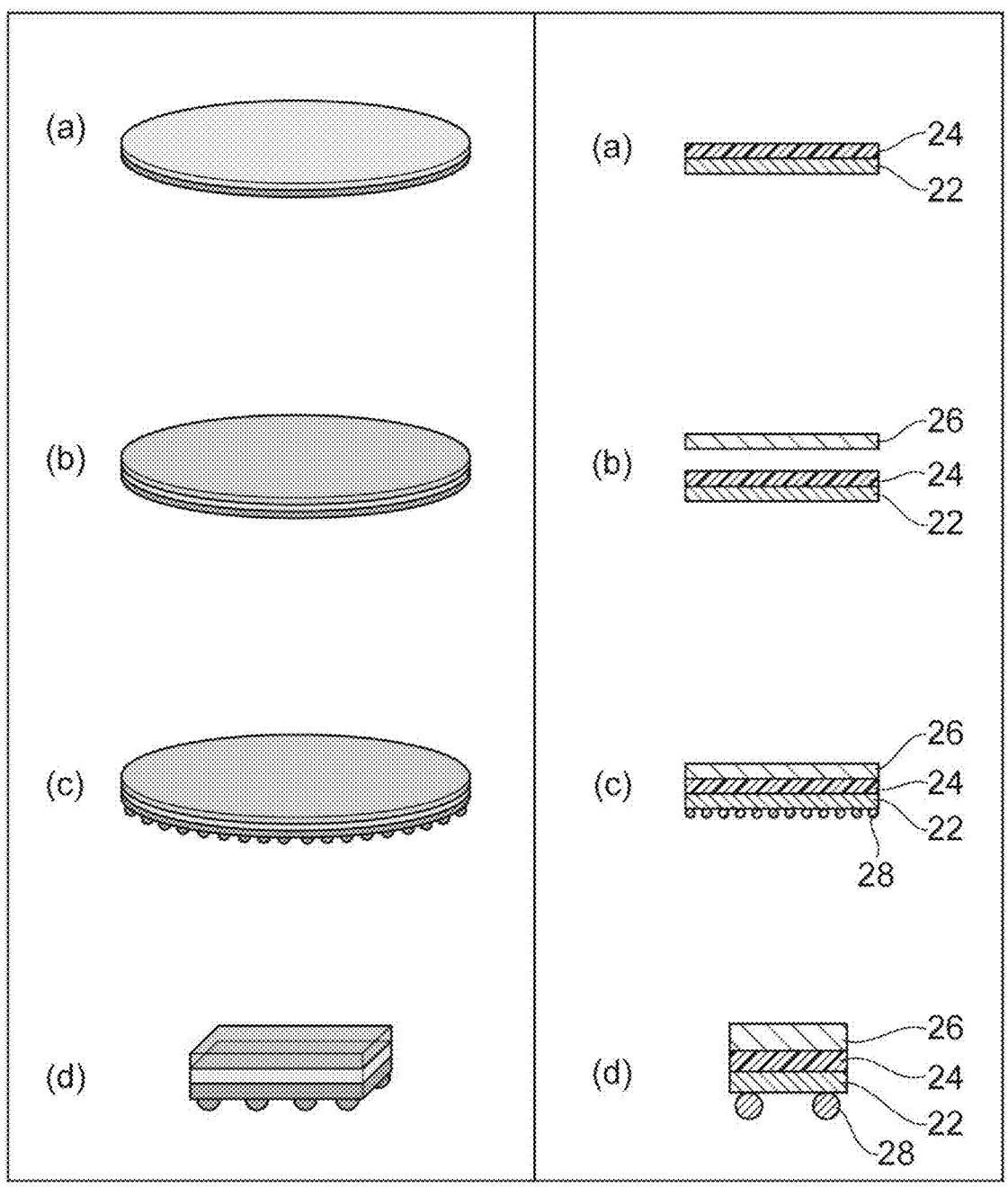
FIG. 7 shows a process drawing illustrating the steps of a method for manufacturing a solid-state imaging element having a non-cavity structure.

Each of FIG. 6 and FIG. 7 is process drawing illustrating the steps of methods for manufacturing solid-state imaging elements having a cavity structure and a non-cavity structure, respectively. In FIG. 6 and FIG. 7, schematic perspective views for individual steps are shown on the left side; whereas the corresponding schematic end views are shown on the right side. In the conventional rib formation process shown in FIG. 6, (a) resin formation (laminate, spin coat), (b) light exposure and development, (c) glass sealing, (d) resin curing and (e) dicing steps are required. To describe more specifically, (a) a resin layer 24 is formed on a substrate 22. (b) The resin layer 24 is exposed to light and developed to form a rib. (c) This was sealed with a glass substrate 26. (d) The resin layer is cured; at the same time, if necessary, back-grinding (BG) processing, formation of through-silicon via (TSV) electrode processing and mounting of the solder balls 28 are performed. (e) The resultant structure is diced to obtain a solid-state imaging element having a cavity structure. In contrast, in the whole surface sealing process shown in FIG. 7, since a rib formation step is not required, the light exposure and development step is not needed. Thus, immediately after an adhesive is formed on a silicon substrate, sealing with a glass substrate can be made. Thereafter, the resultant structure is divided into individual devices by dicing, etc.

In the methods shown in FIG. 6 and FIG. 7, the resin layer 24 is formed on the substrate 22, followed by sealing with the glass substrate 26; however, after the resin layer 24 is formed on the glass substrate 26, sealing with the substrate 22 may be performed.

Examples of a method for manufacturing a solid-state imaging element having a non-cavity structure using the resin composition according to the embodiment include methods shown in FIG. 8 to FIG. 15.

Figure 8:
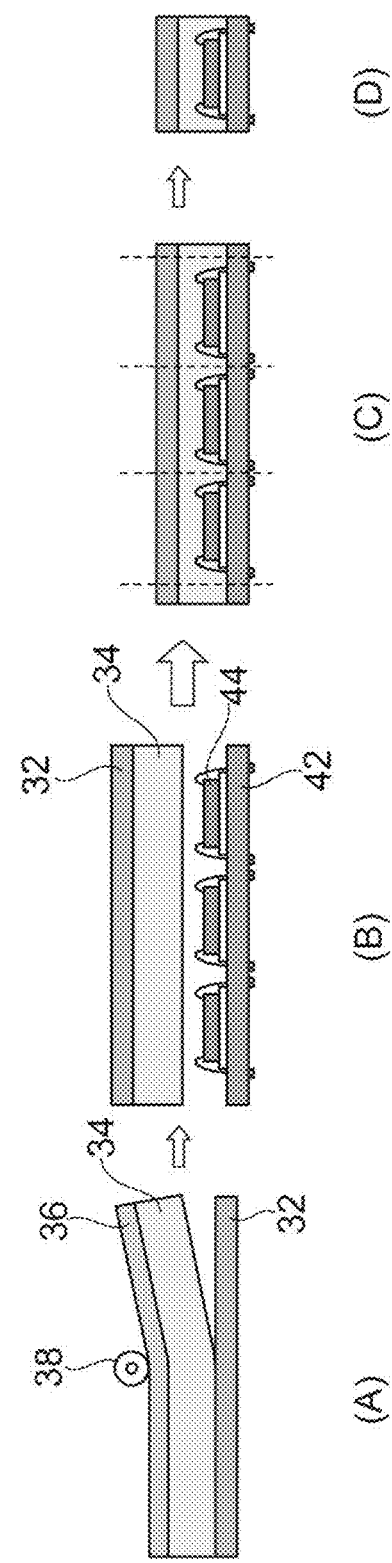
FIG. 8 shows a process drawing illustrating the steps of another method for manufacturing a solid-state imaging element having a non-cavity structure.

FIG. 8 shows a method in which a sheet or film formed of the resin composition according to the embodiment, is laminated on a wafer together with the glass substrate and a resin is cured, and then, dicing is carried out. To describe more specifically, (A) a resin composition in a film form 34 formed on a support film 36 is bonded onto a glass substrate 32 by use of a roller 38. (B) After the support film 36 is removed, the resin composition in a film form 34 having the glass substrate 32 laminated thereon is bonded to a substrate 42 having sensors 44 mounted thereon by applying pressure. (C) This was diced into individual sensors, and then (D) a solid-state imaging element is obtained.

Note that, in FIG. 8, the method of bonding the resin composition in a film form 34 to the glass substrate 32 in advance was explained; however, the resin composition in a film form 34 formed on the support film 36 is bonded to the substrate 42 having the sensors 44 mounted thereon by applying pressure, and then the support film 36 is removed and the glass substrate 32 may be bonded by applying pressure.

Figure 9:
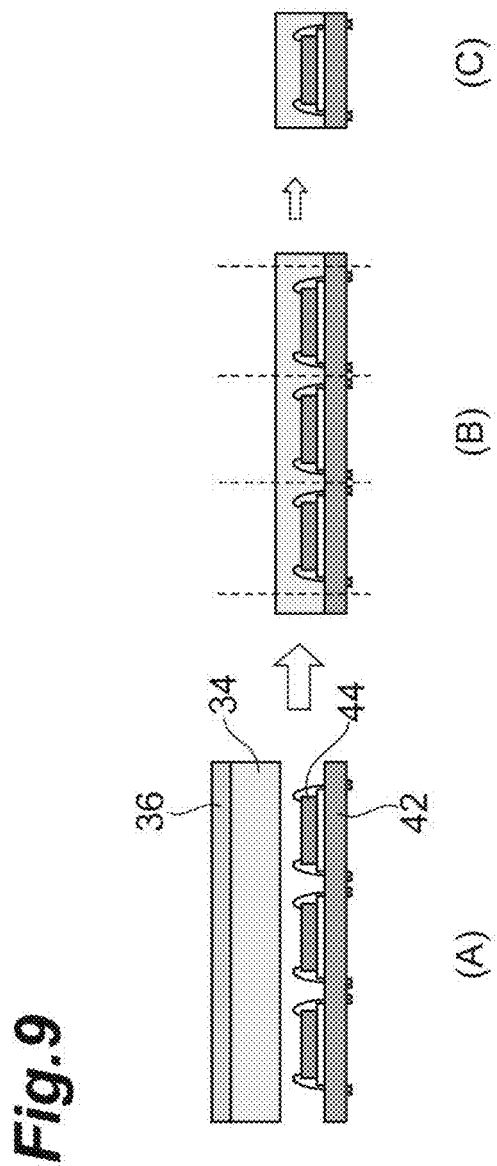
FIG. 9 shows a process drawing illustrating the steps of another method for manufacturing a solid-state imaging element having a non-cavity structure.

The resin composition according to the embodiment provides a cured product having high transparency, airtightness and high refractive index. Thus, the adhesive composition serves as a glass substrate in addition to a function as an adhesive. Because of this, as shown in FIG. 9, a solid-state imaging element not sealed with a glass substrate can be manufactured (see FIG. 16).

Figure 10:
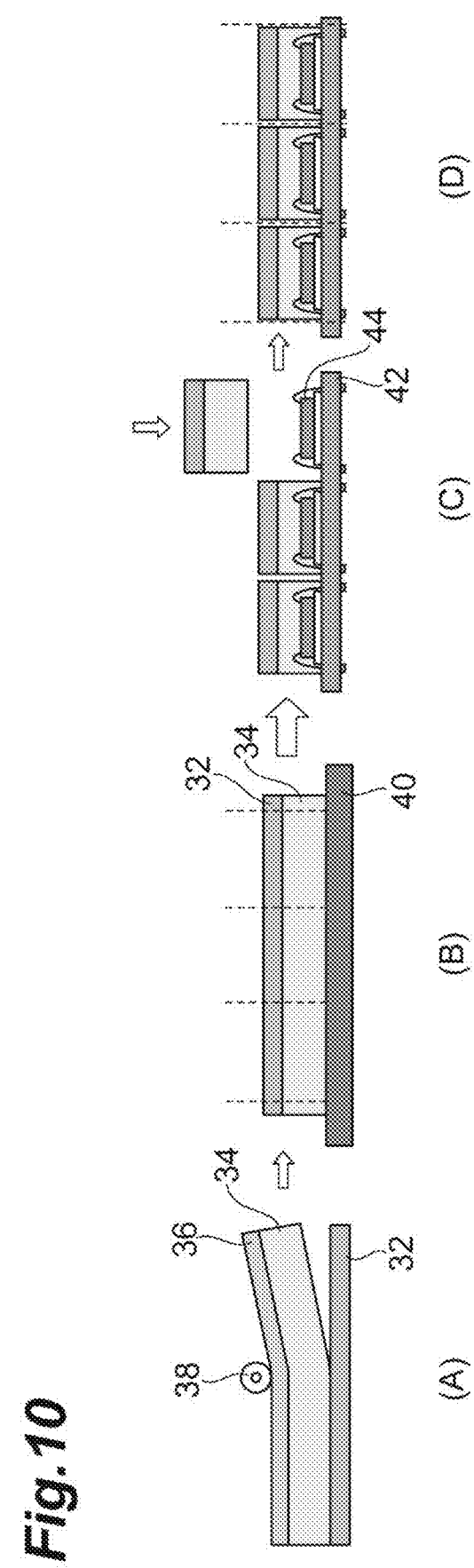
FIG. 10 shows a process drawing illustrating the steps of another method for manufacturing a solid-state imaging element having a non-cavity structure.

Furthermore, a method as shown in FIG. 10 may be employed. More specifically, the resin composition in a film form 34 having the glass substrate 32 laminated thereon is separated into pieces on a support base 40 in advance and the individual pieces of the resin composition in a film form 34 are laminated on the sensors 44.

Figure 11:
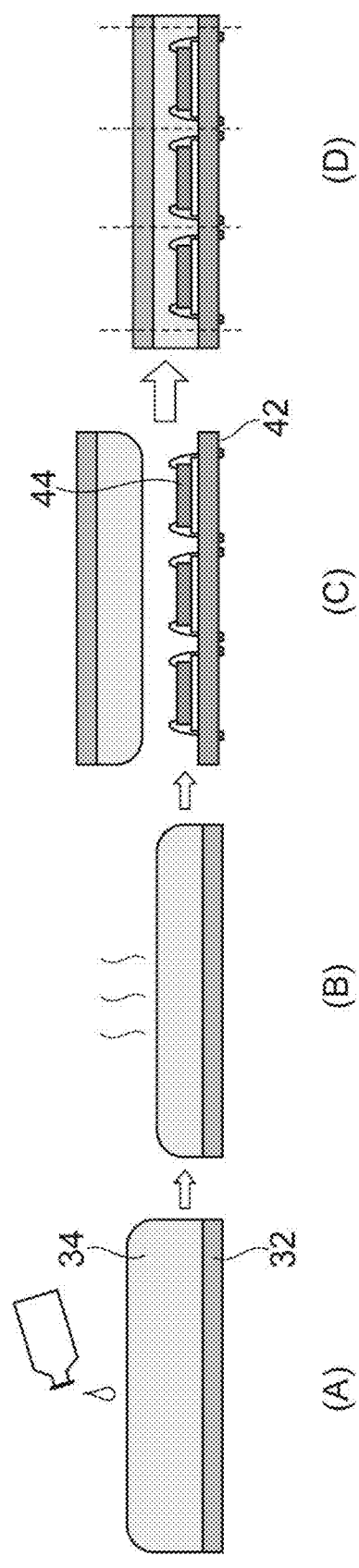
FIG. 11 shows a process drawing illustrating the steps of another method for manufacturing a solid-state imaging element having a non-cavity structure.

In the method shown in FIG. 11, the resin composition according to the embodiment in the state of liquid is applied to a glass substrate in accordance with a spin coat method, etc., and converted into the B stage, and then, laminated on a wafer, a resin is cured and the resultant structure is diced. More specifically, (A) the resin composition 34 is applied onto the glass substrate 32. (B) This is heated to convert the adhesive composition 34 into the B stage. (C) The resin composition 34 in the B stage is bonded to the substrate 42 having the sensors 44 mounted thereon by application of pressure. (D) The resultant structure is diced to obtain solid-state imaging elements.

Figure 13:
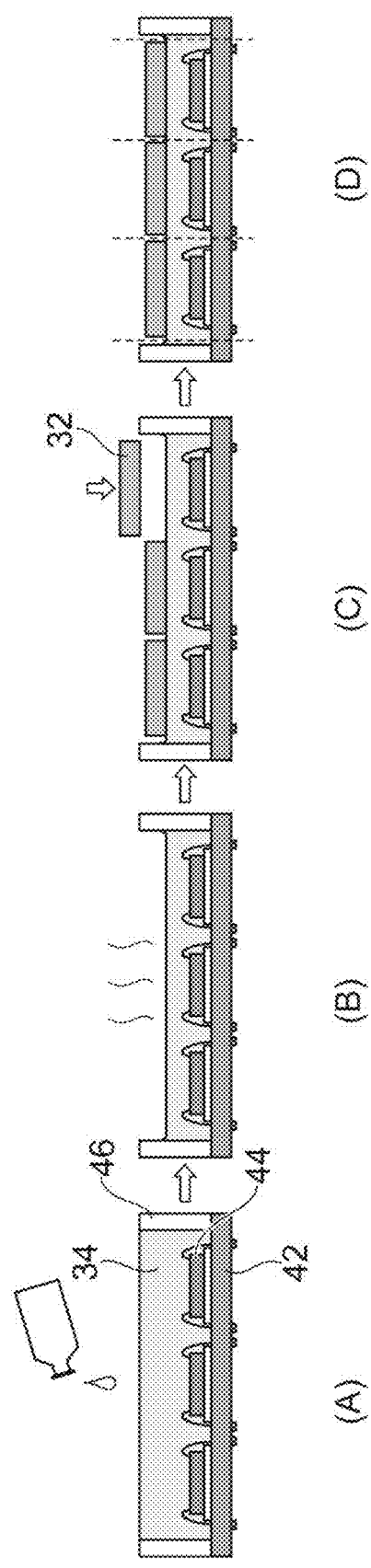
FIG. 13 shows a process drawing illustrating the steps of another method for manufacturing a solid-state imaging element having a non-cavity structure.

Note that, when the resin composition is applied, a weir 46 for keeping the resin composition 34 to stay on the substrate 42 may be provided in the periphery portion, in the same manner as shown in FIG. 13.

Figure 12:
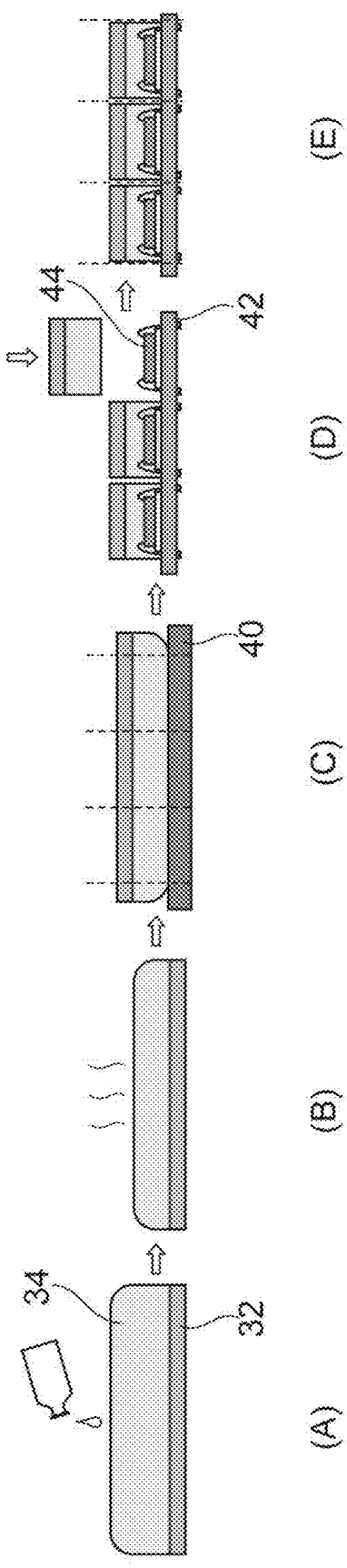
FIG. 12 shows a process drawing illustrating the steps of another method for manufacturing a solid-state imaging element having a non-cavity structure.

As shown in FIG. 12, before lamination on the wafer, the construct consisting of the resin composition 34 converted into the B stage and the glass substrate 32 is diced into pieces on the support base 40 in advance, individual pieces of the construction of resin composition 34 and the glass substrate 32 may be laminated on the sensors 44.

In the method shown in FIG. 13, the resin composition is applied onto a wafer and converted into the B stage on the wafer. The resultant construct is sealed with a glass substrate, a resin is cured and the resultant structure is diced. More specifically, (A) a weir 46 for keeping the resin composition 34 is provided on the periphery portion of the substrate 42 having the sensors 44 mounted thereon, and then the resin composition 34 is applied. (B) This is heated to convert the adhesive composition 34 into the B stage. (C) The pieces of the glass substrate 32 are mounted on the resin composition in the B stage. (D) The resultant structure is diced to obtain solid-state imaging elements.

In the methods shown in FIG. 8 to FIG. 13, the resin composition is formed on a wafer and the construct is diced; however, the resin composition may be formed on diced chips of a wafer.

Figure 14:
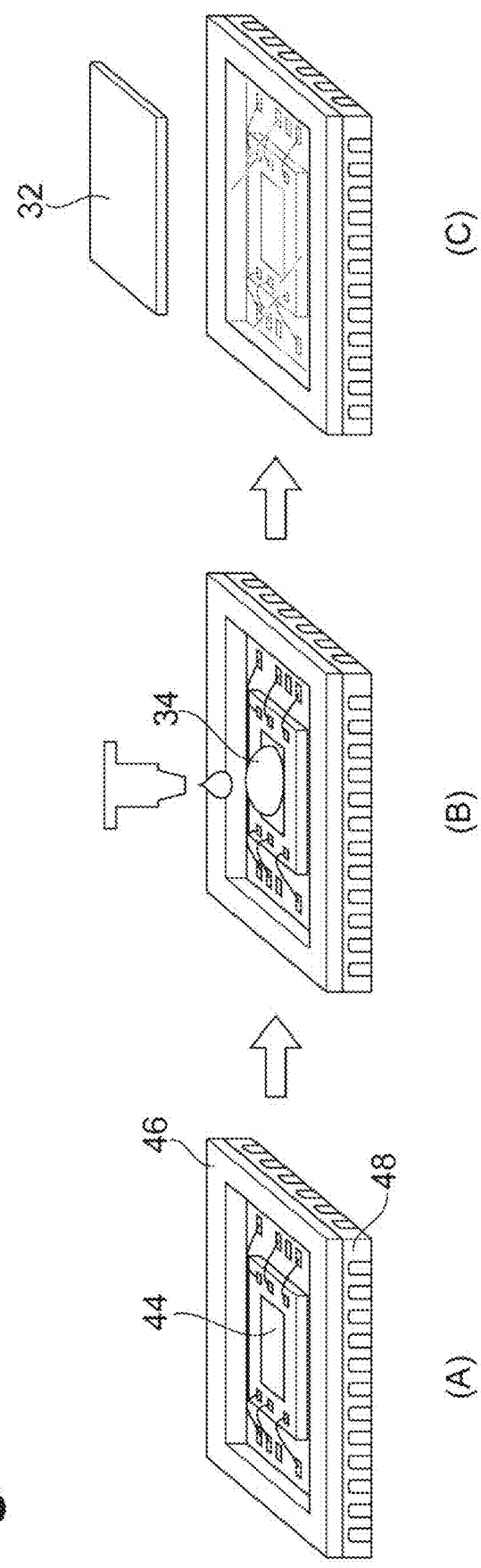
FIG. 14 shows a process drawing illustrating the steps of another method for manufacturing a solid-state imaging element having a non-cavity structure.
Figure 15:
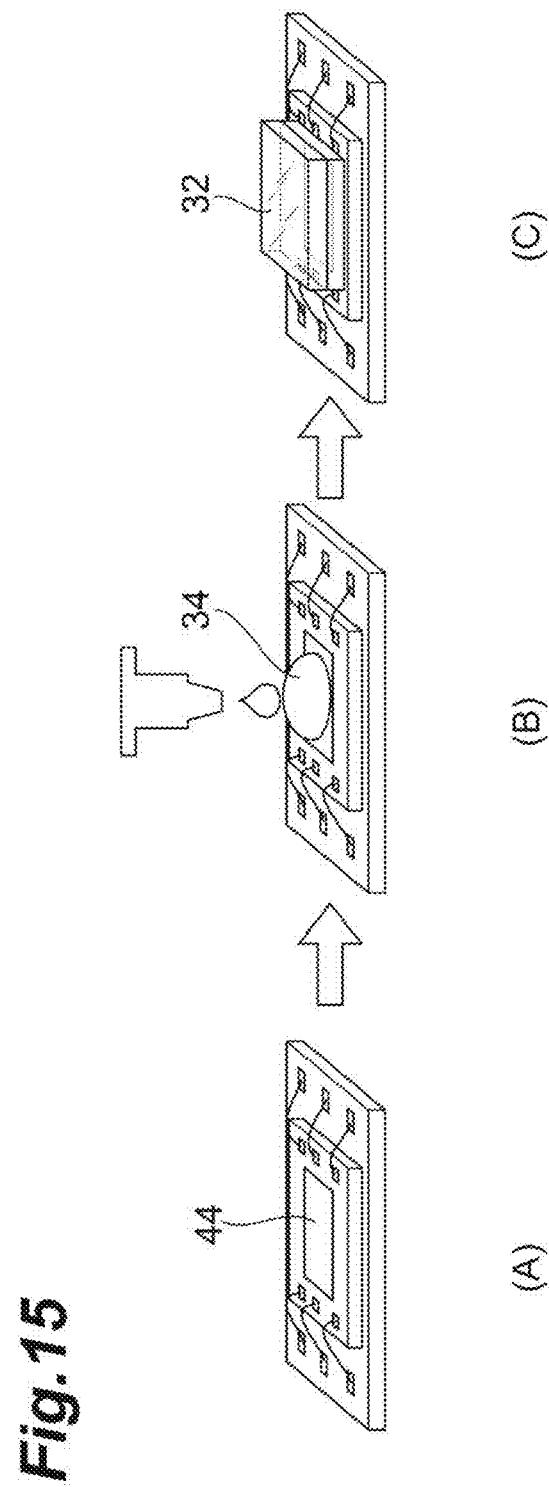
FIG. 15 shows a process drawing illustrating the steps of another method for manufacturing a solid-state imaging element having a non-cavity structure.

FIG. 14 and FIG. 15 show methods of applying a liquid-state resin composition onto a chip having a sensor mounted thereon. In FIG. 14, (A) the weir 46 is provided on the periphery portion of a chip 48 having the sensor 44 mounted thereon. (B) The resin composition 34 is applied onto the sensor 44. (C) Sealing is made by the glass substrate 32 to obtain a solid-state imaging element.

As shown in FIG. 15, the resin composition 34 is applied only to the sensor 44 without providing the weir 46 and then sealing is made by the glass substrate 32.

Note that, in FIG. 14 and FIG. 15, methods of using a liquid-state resin composition were described; however, the resin composition in a film form can be used similarly to the above.

Figure 17:
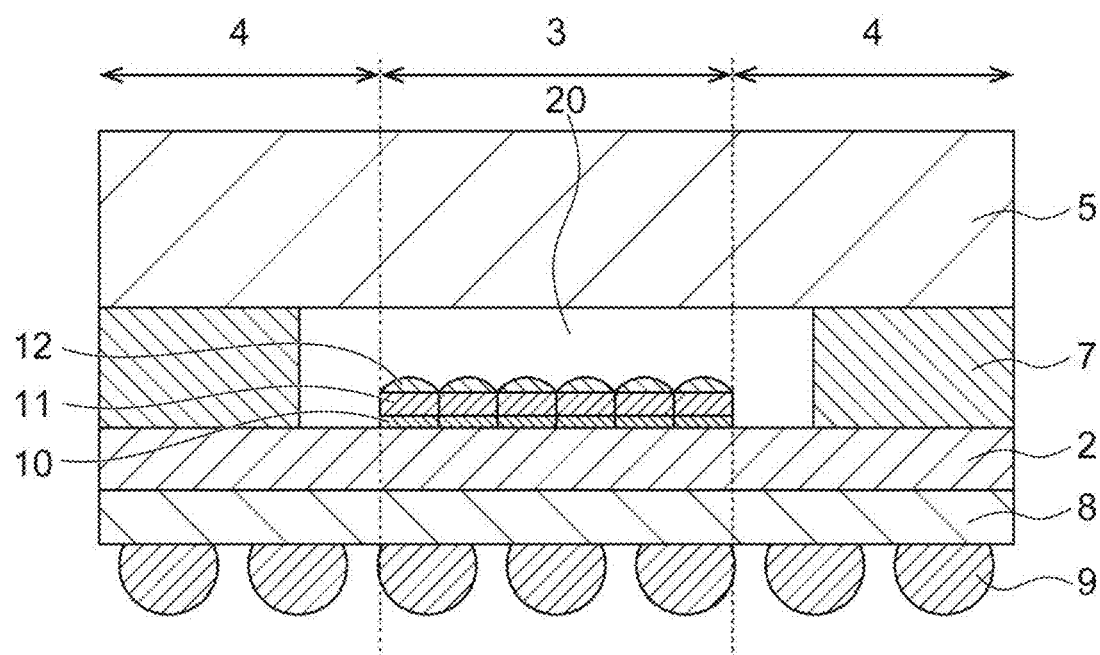
FIG. 17 is a sectional view showing a backside-illuminated solid-state imaging element having a conventional cavity structure.
Figure 18:
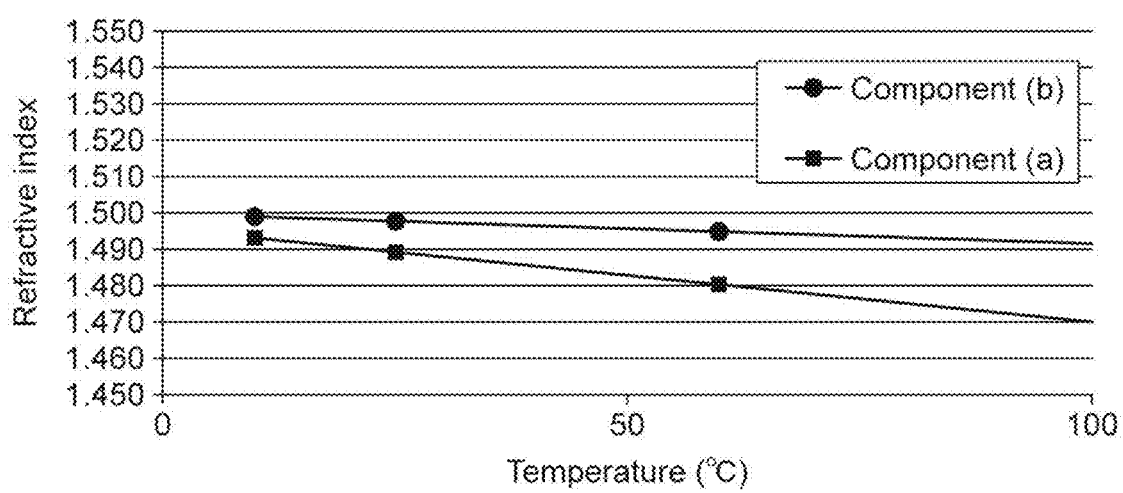
FIG. 18 is a graph showing the results of refractive indexes of the component (a) and the component (b) in Example 1 measured at individual temperatures.
Figure 19:
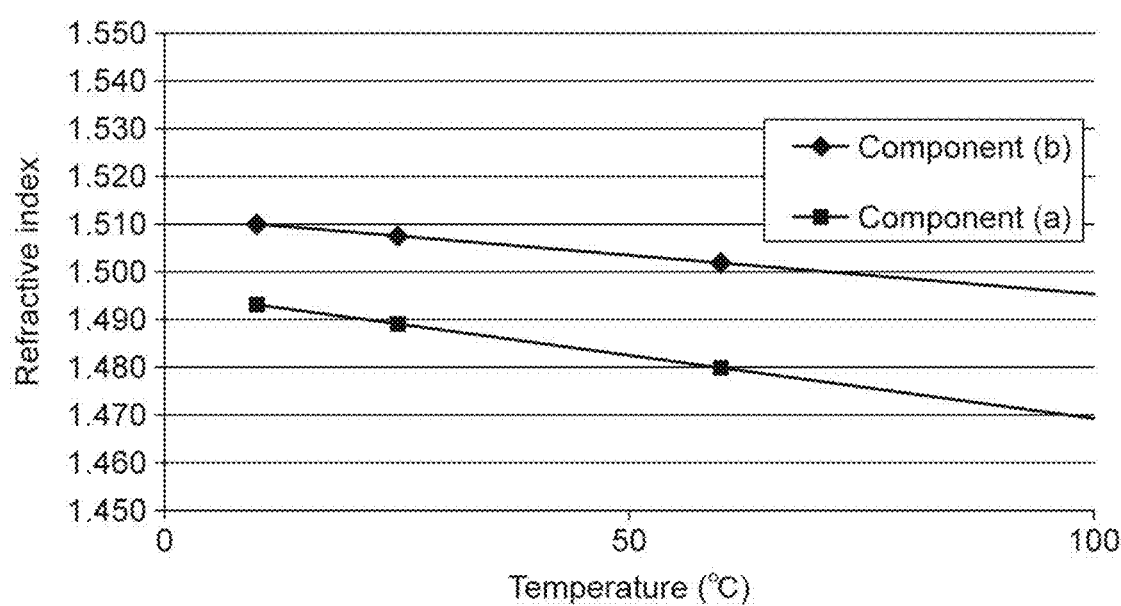
FIG. 19 is a graph showing the results of refractive indexes of the component (a) and the component (b) in Example 5 measured at individual temperatures.
Figure 20:
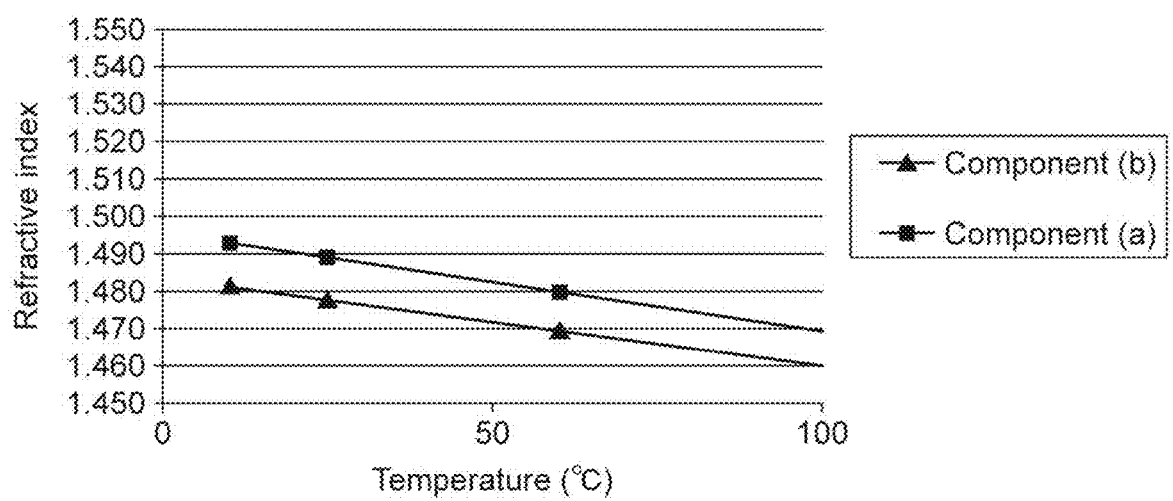
FIG. 20 is a graph showing the results of refractive indexes of the component (a) and the component (b) in Example 6 measured at individual temperatures.
Figure 21:
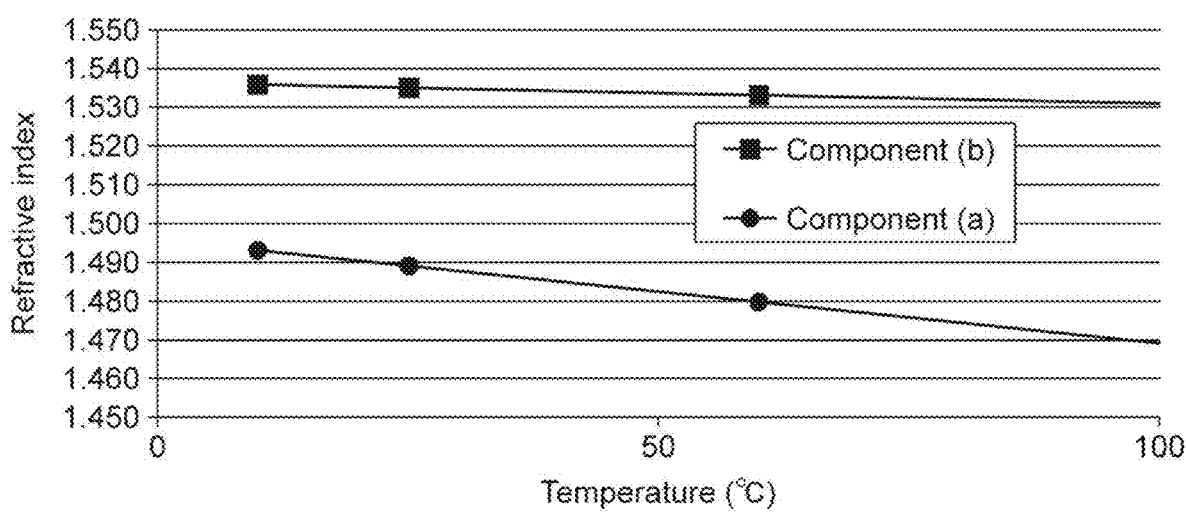
FIG. 21 is a graph showing the results of refractive indexes of the component (a) and the component (b) in Comparative Example 2 measured at individual temperatures.

FIG. 17 is a sectional view showing a backside-illuminated solid-state imaging element having a conventional cavity structure. In FIG. 17, on the silicon substrate 2, a cavity 20 surrounded by a frame-like adhesive layer 7 and the glass substrate 5 is present.

As described, in the conventional cavity structure, a frame-like structure is formed of an adhesive by use of a photolithographic method, a printing method and a dispensing method. Thereafter, it is necessary to bond a glass substrate and a silicon substrate via the obtained frame-like adhesive. Thus, in the cavity structure, the resin composition as used in the present disclosure is not needed; however, an adhesive for forming the frame-like structure is required.

The non-cavity structure using the resin composition according to the embodiment has the following merits compared to conventional cavity structures.

In a cavity structure, if a glass substrate has a flaw, image quality may deteriorate due to light scattering, reflection, diffraction, etc. In this regard, such a deterioration in image quality due to a flaw of a glass substrate can be mitigated by employing the non-cavity structure according to the embodiment because interface refractive-index difference decreases and light scattering, reflection, diffraction, etc., are suppressed.

In the cavity structure, deterioration of image quality is caused by foreign matter bonded to microlenses portion, a glass substrate, etc. Foreign matter is attached because a cavity portion is exposed from formation of an adhesive until a glass substrate is bonded thereto. However, attachment of foreign matter can be reduced if the non-cavity structure according to the embodiment is employed because the exposure duration of the cavity portion is reduced and the amount of foreign matter to be bonded is reduced.

In the non-cavity structure, the adhesive layer must be transparent; however, the area at which the adhesive layer and the glass substrate are bonded is large, difference in stress to be applied by the adhesive within an element is low, compared to the cavity structure where a glass substrate is bonded only by a frame-like adhesive layer, with the result that peeling, deformation, etc., of the adhesive are reduced.

In the cavity structure, α beam emitted from glass is received by microlenses. As a result, there is a possibility of reducing the image quality. For the reason, high purity glass, which is usually expensive, must be used. In contrast, in the non-cavity structure according to the embodiment, since a beam can be absorbed by the adhesive layer, the non-cavity structure has an advantage of using inexpensive glass.

The CMOS image sensor according to the embodiment is integrated in, for example, in-car, medical-use and monitoring cameras and mobile phones. In this case, the CMOS image sensor is integrated in the mother board of each of in-car, medical-use and monitoring cameras and mobile phones via solder balls and optical lenses are arranged above the sensor, more specifically, on the side of the glass substrate.

In the foregoing, the embodiment was explained; however, the present invention is not limited to the embodiment. For example, modification can be appropriately made by those skilled in the art by addition or deletion of constitutional structures or change of design, or addition or deletion of a step(s) or change of conditions with respect to the respective embodiments described above. These modifications are included in the scope of the present invention, as long as the modification is not against the gist of the present invention.

For example, if an optical member is manufactured using a liquid-state resin composition according to the embodiment, a method of injecting the liquid-state resin composition in the space between a wafer or a chip and a glass substrate may be employed.

In the above embodiment, a case where a glass substrate is used as a transparent substrate was described; however, the transparent substrate of the present invention is not limited to this. Any transparent substrate may be used as long as it has necessary strength, rigidity and light transmittance.

Figure 16:
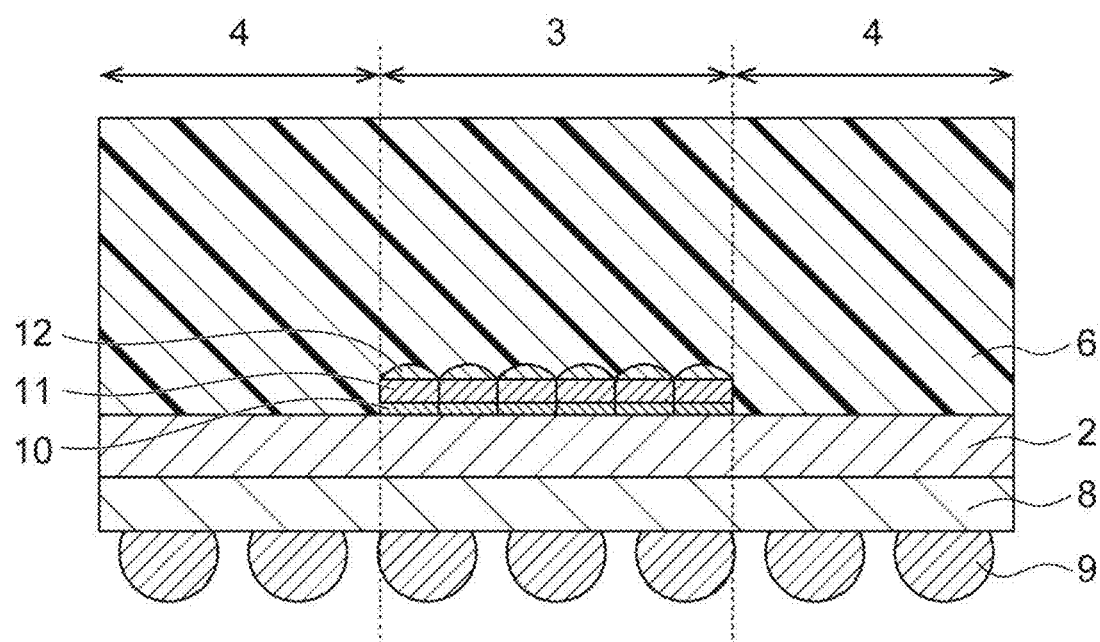
FIG. 16 is a sectional view showing another solid-state imaging element of the embodiment.

As mentioned above, the resin composition according to the embodiment provides a cured product having high transparency, airtightness and a high refractive index. Thus, for example, the solid-state imaging element according to the embodiment may not be sealed with a transparent substrate such as a glass substrate, as shown in FIG. 16.

EXAMPLES

Now, objects and advantages of the present disclosure will be more specifically described by way of Examples; however, the present disclosure is not limited to these Examples. More specifically, specific materials, their amounts, other conditions and details described in Examples should not be construed as limiting the present disclosure.

(Component (a))

The weight-average molecular weight of the component (a) was measured by gel permeation chromatography (GPC) and converted based on a calibration curve using standard polystyrene. The calibration curve was approximated based on a tertiary expression by use of a standard polystyrene kit, PStQuick series C (trade name, TOSOH CORPORATION). The conditions of GPC are shown below.

Pump: L6000 Pump (trade name, Hitachi, Ltd.)
Detector: L3300 RI Monitor (trade name, Hitachi, Ltd.)
Column: Gelpack GL-S300MDT-5 (two columns in total) (trade name, Hitachi High-Technologies Corporation)
Column size: 8 mm in diameter×300 mm
Eluent: DMF/THF (mass ratio: 1/1)+LiBr.$H_2O$ 0.03 mol/l+$H_3PO_4$ 0.06 mol/I
Sample concentration: 0.1 mass %
Flow rate: 1 ml/min
Measurement temperature: 40° C.

<Synthesis of Acrylic Polymer (Component (a))>

(a-1)

300 g of tricyclo [$5.2.1.0^{2,6}$]deca-8-yl acrylate (FA-513A, trade name, Hitachi Chemical Co., Ltd.), 350 g of butyl acrylate (BA), 300 g of butyl methacrylate (BMA), 50 g of glycidyl methacrylate (GMA) and 50 g of 2-ethylhexyl methacrylate (2EHMA) were mixed to obtain a monomer mixture. To the monomer mixture thus obtained, 5 g of dilauroyl peroxide and 0.45 g of n-octyl mercaptan serving as a chain transfer agent were further dissolved to obtain a mixture solution.

To a 5-L autoclave equipped with a stirrer and a condenser, 0.44 g of polyvinyl alcohol serving as a suspension agent and 2000 g of ion-exchange water were added. Further, the mixture solution prepared above was added thereto while stirring. Polymerization was carried out while stirring at a rotation speed of 250 $min^{-1}$ under a nitrogen atmosphere at 60° C. for 5 hours, and subsequently at 90° C. for two hours to obtain resin particles (polymerization rate was 99% by the weighing method). The resin particles were washed with water, dehydrated and dried to obtain an acrylic polymer (a-1). The weight-average molecular weight Mw of the resultant polymer (a-1) was 480000.

(a-2)

An acrylic polymer (a-2) was obtained in the same manner as in (a-1) except that 3 mass % of acrylonitrile (AN) was further added to the monomer mixture. The weight-average molecular weight Mw of the obtained (a-2) was 380000.

(a-3)

An acrylic polymer (a-3) was obtained in the same manner as in (a-1) except that a glycidyl methacrylate (GMA) was not used. The weight-average molecular weight Mw of the resultant polymer (a-3) was 520000.

(a-4)

An acrylic polymer (a-4) was obtained in the same manner as in (a-1) except that the starting amount of a glycidyl methacrylate (GMA) increased 4.4 fold (220 g) and the starting amount of each of the other monomers was reduced by 16% on a weight basis. The weight-average molecular weight Mw of the resultant polymer (a-4) was 490000.

Examples 1 to 14 and Comparative Examples 1 to 3

The acrylic polymers (a-1) to (a-4) and the following components were blended in accordance with the blending proportion (parts by mass) shown in Table 1 to obtain resin compositions. Note that, in Table 1, the numerals in the columns of components except the organic solvent represent solid contents in terms of parts by mass. Note that the solid content used in the specification refers to a nonvolatile content of a resin composition excluding volatile substances such as water and a solvent, more specifically, refers to components except a solvent, remaining without volatile in a drying step and including components present in a liquid, syrupy and waxy state at room temperature near 25° C.

(Component (b))

NK ester A-DOG (trade name of dioxane glycol diacrylate, SHIN-NAKAMURA CHEMICAL CO., LTD.)
NK ester A-DCP (trade name of tricyclodecanedimethanol diacrylate, SHIN-NAKAMURA CHEMICAL CO., LTD.)
FANCRYL FA-513AS (trade name of dicyclopentanyl acrylate, Hitachi Chemical Co., Ltd.)
ACMO (trade name of acryloylmorpholine, KJ Chemicals Corporation)
FANCRYL FA-117A (trade name of isostearyl acrylate, Hitachi Chemical Co., Ltd.)
FANCRYL FA-321M (trade name of ethylene oxide-modified bisphenol A dimethacrylate, Hitachi Chemical Co., Ltd.)
Aronix M-313 (trade name of isocyanuric acid ethylene oxide-modified diacrylate, TOAGOSEI CO., LTD.)
NK ester A-DPH (trade name of dipentaerythritol hexaacrylate, SHIN-NAKAMURA CHEMICAL CO., LTD.).

(Component (c))
PERCUMYL D (trade name of dicumyl peroxide, NOF CORPORATION, one hour half-life temperature: 135.7° C., 10 hours half-life temperature: 116.4° C.)
(Adhesion Aid)
KBM-503 (trade name of a silane coupling agent: 3-(trimethoxysilyl)propyl methacrylate, Shin-Etsu Chemical Co., Ltd.) (Component (d))
ADEKA STAB AO-80 (trade name of a hindered phenolic antioxidant: bis[3-(3-tert-butyl-4-hydroxy-5-methylphenyl)propionate](2,4,8,10-tetraoxaspiro[5.5]undecane-3,9-diyl)bis(2,2-dimethyl-2,1-ethanediyl), ADEKA CORPORATION.)
(Solvents)
PGMEA (chemical substance name of propylene glycol 1-monomethyl ether 2-acetate, KANTO KAGAKU.)
<Measurement of Refractive Index>
Using "Abbe refractometer", which is a device for obtaining a refractive index based on a critical angle, as a refractometer, the refractive indexes at a wavelength 589 nm (sodium D-line) were obtained.
All measurements were carried out in a light permeation system.
Refractive indexes at 10° C., 25° C. and 60° C. were measured by adjusting the temperature of a constant temperature water tank attached to the refractometer. Note that, a measurement sample was placed on the "Abbe refractometer" and allowed to stand still for at least 30 minutes and thereafter measurement was performed.
The refractive index at 100° C. was obtained by calculation as a theoretical value in accordance with linear approximation based on refractive index values at 10° C., 25° C. and 60° C.
More specifically, the refractive indexes of the component (a) and the component (b) at each of the aforementioned temperatures were measured in accordance with the following method and then an absolute value of the refractive index difference at each temperature was obtained. The results are shown in Table 2.
The measurement results on refractive indexes of the component (a) and the component (b) at individual temperatures in Examples 1, 5, 6 and Comparative Example 2 are shown in the graphs of FIGS. 18 to 21.
The refractive indexes of the resin compositions of Examples 1 and 4, as measured in the same manner as in the following method of measuring the refractive index of the component (a) at room temperature, were 1.494 and 1.493, respectively.
<Method of Measuring the Refractive Index of the Component (a) (Polymer)>
The polymer was diluted with a PGMEA solvent to prepare varnish. The varnish was applied to a release PET film (FILMBYNA 38E-0010GC (trade name), manufactured by FUJIMORI KOGYO CO., LTD.) by use of an applicator and dried at 100° C./10 minutes to obtain a polymer film having a film thickness of 100 μm. The polymer film thus obtained was removed from the PET film and placed on a main prism of a multi-wavelength Abbe refractometer (DR-M2 (trade name), manufactured by ATAGO CO., LTD.). Refractive index was measured by use of a sun-lighting glass at the respective temperatures.
As the buffer solution, a monobromonaphthalene solution was used.

<Method of Measuring the Refractive Index of the Component (b)>
Case where the component (b) is liquid
The liquid of the component (b) was allowed to fall in drops on the main prism of multi-wavelength Abbe refractometer, and sandwiched between sub prisms, and then refractive index was measured.
Case where the component (b) is solid
The component (b) was diluted with a PGMEA solvent to prepare varnish. The varnish was applied to a release PET film (FILMBYNA 38E-0010GC (trade name), manufactured by FUJIMORI KOGYO CO., LTD.) by use of an applicator and dried at 100° C./10 minutes to obtain a resin film having a film thickness of 100 μm. The resin film thus obtained was removed from the PET film and placed on a main prism of a multi-wavelength Abbe refractometer (DR-M2 (trade name), manufactured by ATAGO CO., LTD.). Refractive index was measured by use of a sun-lighting glass at individual temperatures.
Case where the component (b) is a combination of a plurality of compounds
If the compounds to be used in combination as the component (b) were all liquid at normal temperature, they were mixed and dissolved. After it was checked that the compounds neither remain undissolved nor separate, the liquid was allowed to fall in drops on the main prism of the Abbe refractometer, and sandwiched between sub prisms and then refractive index was measured.
If the compounds to be used in combination as the component (b) are all solid at normal temperature, varnish was prepared by diluting the compounds with a PGMEA solvent and then refractive index was measured in the same manner as in the above section of "Case where the component (b) is solid".
Note that, the refractive index in the case where the component (b) is a combination of a plurality of compounds can be also obtained theoretically by calculation.

Refractive index={(starting amount of monomer $A$×refractive index of monomer $A$)+(starting amount of monomer $B$×refractive index of monomer $B$)}/total of starting amounts of monomers $A$ and $B$ (Transmittance of Cured Film @400 nm)
The resin compositions obtained in Examples and Comparative Examples were each uniformly applied onto a glass substrate (MATSUNAMI MICRO COVER GLASS 40 mm×50 mm THICKNESS No. 1 (trade name), Matsunami Glass Ind., Ltd.), having a size of 4.0 cm×5.0 cm×120 to 170 μm (actually 140 to 160 μm) by use of a spin coater, and dried by a hot plate of 100° C. for 10 minutes to form an adhesive layer having a dry film thickness of 50 μm. To the adhesive layer, a glass substrate (MATSUNAMI MICRO COVER GLASS 40 mm×50 mm THICKNESS No. 1 (trade name), Matsunami Glass Ind., Ltd.) having a size of 4.0 cm×5.0 cm×120 to 170 μm (actually 140 to 160 μm) was bonded by a roll laminator at 90° C. to obtain a test substrate having a three-layer structure: glass substrate/adhesive layer/glass substrate. The adhesive layer of the test substrate thus obtained was cured at 200° C. for 2 hours to obtain a test piece for measurement.
The test pieces for measurement were subjected to measurement of transmittance performed by use of a spectrophotometer U-4100 (trade name, Hitachi, Ltd.; start: 800 nm, end: 300 nm, scan speed: 600 nm/min, sampling interval: 1.0 nm) at a wavelength of 400 nm. Note that, as a base line, transmittance values through two single glass substrates were used. The measurement results were evaluated in accordance with the following criteria. The results are shown in Table 2.

A: Transmittance at a wavelength of 400 nm is 99% or more.

B: Transmittance at a wavelength of 400 nm is 95% or more and less than 99%.

C: Transmittance at a wavelength of 400 nm is 90% or more and less than 95%.

D: Transmittance at a wavelength of 400 nm is less than 90%.

(Transmittance of Cured Film @589 nm)

The measurement test pieces mentioned above were subjected to measurement of transmittance performed by a spectrophotometer U4100 (trade name, Hitachi, Ltd., start 800 nm, end: 300 nm, scan speed: 600 nm/min, sampling interval: 1.0 nm) at a wavelength of 589 nm. Note that, as a base line, transmittance values through two single glass substrates were used. The measurement results were evaluated in accordance with the following criteria. The results are shown in Table 2.

A: Transmittance at a wavelength of 589 nm is 99% or more.

B: Transmittance at a wavelength of 589 nm is 95% or more and less than 99%.

C: Transmittance at a wavelength of 589 nm is 90% or more and less than 95%.

D: Transmittance at a wavelength of 589 nm is less than 90%.

(Visual Observation at Normal Temperature, 60° C. and 100° C.)

Coloration of the measurement test pieces mentioned above was visually determined at normal temperature (25° C.). Furthermore, the measurement test pieces mentioned above were placed on a hot plate heated at 60° C. or 100° C. One minute later, coloration of cured films was visually determined. The results are shown in Table 2.

A: Transparency or very slight turbidity was visually observed

B: Turbidity was visually observed

C: Significant turbidity was observed (Peeling Resistance During a Reflow Process)

The measurement test pieces used in the above transmittance test were allowed to stand still on a hot plate of 260° C. for 30 seconds, returned to the environment of room temperature (25° C.) and kept there for 5 minutes. The appearance of the test substrates was visually observed and peel resistance during a reflow process was evaluated based on the following criteria. The results are shown in Table 2.

A: Change is not observed, enlargement of void or peeling crack is not observed.

B: One of void, peeling and crack is observed.

C: Two or more of void, peeling and crack are observed.

D: Peeling over the surface occurs.

TABLE 1

| Composition | | | Example | | | | | | | | | | | | | Comparative Example | | |
|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 1 | 2 | 3 |
| Component (a) | Acrylic polymer (a-1) | 50 | 50 | 50 | 50 | 50 | — | — | — | 50 | 50 | — | 82 | 37 | 34 | 50 | 50 | 50 |
| | Acrylic polymer (a-2) | — | — | — | — | — | — | — | — | — | — | 50 | — | — | — | — | — | — |
| | Acrylic polymer (a-3) | — | — | — | — | — | 50 | — | — | — | — | — | — | — | — | — | — | — |
| | Acrylic polymer (a-4) | — | — | — | — | — | — | 50 | 50 | — | — | — | — | — | — | — | — | — |
| Component (b) | A-DOG | 50 | 25 | 40 | 40 | 25 | 50 | 50 | — | 35 | 40 | 25 | 18 | 63 | 66 | — | — | — |
| | A-DCP | — | 25 | — | — | — | — | — | — | — | — | — | — | — | — | — | — | — |
| | FA-513AS | — | — | 10 | — | — | — | — | — | — | — | — | — | — | — | — | — | — |
| | ACMO | — | — | — | 10 | — | — | — | — | — | — | — | — | — | — | — | — | — |
| | FA-117A | — | — | — | — | 25 | — | — | 25 | — | — | 25 | — | — | — | — | — | — |
| | FA-321M | — | — | — | — | — | — | — | — | — | — | — | — | — | — | 50 | — | — |
| | M-313 | — | — | — | — | — | — | — | 25 | — | 10 | — | — | — | — | — | 50 | — |
| | A-DPH | — | — | — | — | — | — | — | — | 15 | — | — | — | — | — | — | — | 50 |
| Component (c) | PERCUMYL D | 1 | 1 | 1 | 1 | 1 | 1 | 1 | 1 | 1 | 1 | 1 | 1 | 1 | 1 | 1 | 1 | 1 |
| Component (d) | AO-80 | 1 | 1 | 1 | 1 | 1 | 1 | 1 | 1 | 1 | 1 | 1 | 1 | 1 | 1 | 1 | 1 | 1 |
| Adhesive aid | KBM-503 | 1 | 1 | 1 | 1 | 1 | 1 | 1 | 1 | 1 | 1 | 1 | 1 | 1 | 1 | 1 | 1 | 1 |
| p | PGMEA | 100 | 100 | 100 | 100 | 100 | 100 | 100 | 100 | 100 | 100 | 100 | 100 | 100 | 100 | 100 | 100 | 100 |

TABLE 2

| Evaluation | Example | | | | | | | | | |
|---|---|---|---|---|---|---|---|---|---|---|
| | 1 | 2 | 3 | 4 | 5 | 6 | 7 | 8 | 9 | 10 |
| Absolute value of refractive index difference @10° C. | 0.006 | 0.016 | 0.012 | 0.012 | 0.012 | 0.006 | 0.005 | 0.007 | 0.011 | 0.014 |
| Absolute value of refractive index difference @25° C. | 0.008 | 0.018 | 0.014 | 0.014 | 0.016 | 0.009 | 0.007 | 0.002 | 0.013 | 0.016 |
| Absolute value of refractive index difference @60° C. | 0.015 | 0.022 | 0.019 | 0.020 | 0.011 | 0.015 | 0.015 | 0.008 | 0.019 | 0.013 |
| Absolute value of refractive index difference @100° C. | 0.022 | 0.027 | 0.025 | 0.026 | 0.009 | 0.022 | 0.023 | 0.009 | 0.025 | 0.030 |

TABLE 2-continued

| Evaluation | | | | | | | | | | |
|---|---|---|---|---|---|---|---|---|---|---|
| Transmittance @ 400 nm | 100 | 100 | 100 | 100 | 100 | 100 | 97 | 96 | 94 | 97 |
| Visual observation at normal temperature | A | A | A | A | A | A | A | A | A | A |
| Visual observation at 60° C. | A | A | A | A | A | A | A | A | A | A |
| Visual observation at 100° C. | A | A | A | A | A | A | A | A | A | A |
| Transmittance @ 589 nm | 100 | 100 | 100 | 100 | 100 | 100 | 100 | 100 | 100 | 100 |
| Peeling resistance in a reflow process | A | A | A | A | A | B | A | A | A | A |

| | | Example | | | | Comparative Example | | |
|---|---|---|---|---|---|---|---|---|
| | Evaluation | 11 | 12 | 13 | 14 | 1 | 2 | 3 |
| | Absolute value of refractive index difference @10° C. | 0.003 | 0.006 | 0.006 | 0.006 | 0.040 | 0.044 | 0.022 |
| | Absolute value of refractive index difference @25° C. | 0.007 | 0.008 | 0.008 | 0.008 | 0.043 | 0.046 | 0.023 |
| | Absolute value of refractive index difference @60° C. | 0.002 | 0.015 | 0.015 | 0.015 | 0.050 | 0.052 | 0.028 |
| | Absolute value of refractive index difference @100° C. | 0.002 | 0.022 | 0.022 | 0.022 | 0.058 | 0.058 | 0.033 |
| | Tramittance @ 400 nm | 92 | 100 | 100 | 99 | 84 | 86 | 96.5 |
| | Visual observation at normal temperature | A | A | A | A | A | A | A |
| | Visual observation at 60° C. | A | A | A | A | C | C | C |
| | Visual observation at 100° C. | A | A | A | A | C | C | C |
| | Transmittance @ 589 nm | 100 | 100 | 100 | 100 | 97.5 | 98 | 99 |
| | Peeling resistance in a reflow process | B | B | A | B | A | B | C |

REFERENCE SIGNS LIST

1 . . . Solid-state imaging element, 2 . . . Silicon substrate, 3 . . . Sensor section, Light receiving section, 4 . . . Peripheral circuit, 5, 26, 32 . . . Glass substrate, 6 . . . Adhesive layer, 7 . . . Frame-like adhesive layer, 8 . . . Wiring layer, 9, 28 . . . Solder ball, 10 . . . Photodiode, 11 . . . Color filter, 12 . . . Microlens, 20 . . . Cavity, 22, 42 . . . Substrate, 24 . . . Resin layer, 34 . . . Adhesive composition, 36 . . . Support film, 38 . . . roller, 40 . . . Support base, 44 . . . Sensor, 46 . . . Weir, 48 . . . Chip.

The invention claimed is:

1. A resin composition comprising:

(a) an acrylic polymer having a weight-average molecular weight ranging from 100000 to 3000000, (b) a monofunctional (meth)acrylic compound, (c) a polymerization initiator, and (d) an antioxidant wherein an absolute value of refractive index difference between the (a) acrylic polymer and the (b) monofunctional (meth)acrylic compound at 100° C. is 0.031 or less.

2. The resin composition according to claim 1, wherein the (a) acrylic polymer contains at least one structural unit represented by the following formula (I)

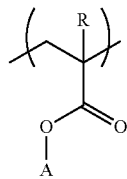

(I)

where A represents an alicyclic group having 5 to 22 carbon atoms optionally having a substituent; and R represents a hydrogen atom or a methyl group.

3. The resin composition according to claim 1, wherein the (a) acrylic polymer contains at least one structural unit represented by the following formula (II)

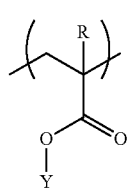

(II)

where Y represents a linear or branched alkyl group having 1 to 10 carbon atoms optionally having a substituent; and R represents a hydrogen atom or a methyl group.

4. The resin composition according to claim 1, wherein the (a) acrylic polymer contains at least one structural unit represented by the following formula (III)

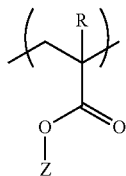
(III)

where Z represents a group containing at least one functional group selected from the group consisting of a carboxyl group, a hydroxyl group, an acid anhydride group, an amino group, an amide group, an epoxy group and a nitrile group; and R represents a hydrogen atom or a methyl group.

5. The resin composition according to claim 1, for use in optical parts.

6. A method for manufacturing a semiconductor device comprising:
   a step of forming an adhesive layer of the resin composition according to claim 1 on a semiconductor substrate,
   a step of sandwiching the adhesive layer between the semiconductor substrate and a transparent substrate, and applying pressure onto the semiconductor substrate and the transparent substrate for bonding, and
   a step of curing the adhesive layer.

7. A solid-state imaging element comprising:
   a semiconductor substrate having a light receiving section provided on the upper surface,
   an adhesive layer provided on the semiconductor substrate so as to cover the light receiving section, and
   a transparent substrate bonded to the semiconductor substrate by the adhesive layer, wherein
   the adhesive layer is formed of the resin composition according to claim 1.

8. The resin composition according to claim 2, wherein the (a) acrylic polymer contains at least one structural unit represented by the following formula (II)

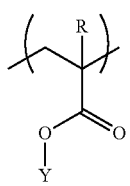
(II)

where Y represents a linear or branched alkyl group having 1 to 10 carbon atoms optionally having a substituent; and R represents a hydrogen atom or a methyl group.

9. The resin composition according to claim 2, wherein the (a) acrylic polymer contains at least one structural unit represented by the following formula (III)

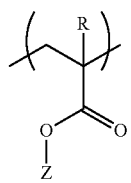
(III)

where Z represents a group containing at least one functional group selected from the group consisting of a carboxyl group, a hydroxyl group, an acid anhydride group, an amino group, an amide group, an epoxy group and a nitrile group; and R represents a hydrogen atom or a methyl group.

10. The resin composition according to claim 3, wherein the (a) acrylic polymer contains at least one structural unit represented by the following formula (III)

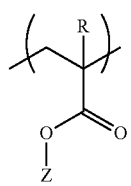
(III)

where Z represents a group containing at least one functional group selected from the group consisting of a carboxyl group, a hydroxyl group, an acid anhydride group, an amino group, an amide group, an epoxy group and a nitrile group; and R represents a hydrogen atom or a methyl group.

11. A solid-state imaging element comprising:
   a semiconductor substrate having a light receiving section provided on the upper surface,
   an adhesive layer provided on the semiconductor substrate so as to cover the light receiving section, and
   a transparent substrate bonded to the semiconductor substrate by the adhesive layer, wherein
   the adhesive layer is formed of the resin composition according to claim 2.

12. A solid-state imaging element comprising:
   a semiconductor substrate having a light receiving section provided on the upper surface,
   an adhesive layer provided on the semiconductor substrate so as to cover the light receiving section, and
   a transparent substrate bonded to the semiconductor substrate by the adhesive layer, wherein
   the adhesive layer is formed of the resin composition according to claim 3.

13. A solid-state imaging element comprising:
   a semiconductor substrate having a light receiving section provided on the upper surface,
   an adhesive layer provided on the semiconductor substrate so as to cover the light receiving section, and
   a transparent substrate bonded to the semiconductor substrate by the adhesive layer, wherein
   the adhesive layer is formed of the resin composition according to claim 4.

14. An optical part comprising a cured form of the resin composition according to claim 1.

* * * * *